United States Patent

Tanizaki et al.

[11] Patent Number: 6,147,544
[45] Date of Patent: Nov. 14, 2000

[54] DATA TRANSFER CIRCUIT TRANSFERRING COMPLEMENTARY DATA SIGNALS

[75] Inventors: Hiroaki Tanizaki; Hideto Hidaka; Masatoshi Ishikawa, all of Hyogo, Japan

[73] Assignee: Mitsubishi Denki Kabushiki Kaisha, Tokyo, Japan

[21] Appl. No.: 09/270,051

[22] Filed: Mar. 16, 1999

[30] Foreign Application Priority Data

Oct. 22, 1998 [JP] Japan .................................. 10-300896

[51] Int. Cl.⁷ .......................... H03K 17/62; H03K 17/76; H03K 17/693; H03K 17/735
[52] U.S. Cl. ............................ 327/403; 327/407; 710/100
[58] Field of Search ..................................... 327/403, 404, 327/407, 408; 710/100, 101, 106; 713/300; 365/203

[56] References Cited

U.S. PATENT DOCUMENTS 5,029,134 7/1991 Watanabe ............................ 365/189.05
5,714,893 2/1998 Aimoto et al. ............................ 327/51

FOREIGN PATENT DOCUMENTS 1-128292 5/1989 Japan .
4-252496 9/1992 Japan .

*Primary Examiner*—Terry D. Cunningham
*Assistant Examiner*—Quan Tra
*Attorney, Agent, or Firm*—McDermott, Will & Emery

[57] ABSTRACT

First and second pairs of input/output lines transfer mutually complementary data signals respectively. First and second selection circuits select a signal transfer line having the same potential as that of a signal transfer line not precedently selected from two precedently selected signal transfer lines among first to third signal transfer lines and the signal transfer line not precedently selected and connect first ends thereof to the first pair of input/output lines respectively while connecting second ends thereof to the second pair of input/output lines respectively. Thus, no precharging may be performed for equalizing the potentials of the two signal transfer lines selected for present data transfer with each other, and hence reduction of a data transfer rate can be prevented.

17 Claims, 21 Drawing Sheets

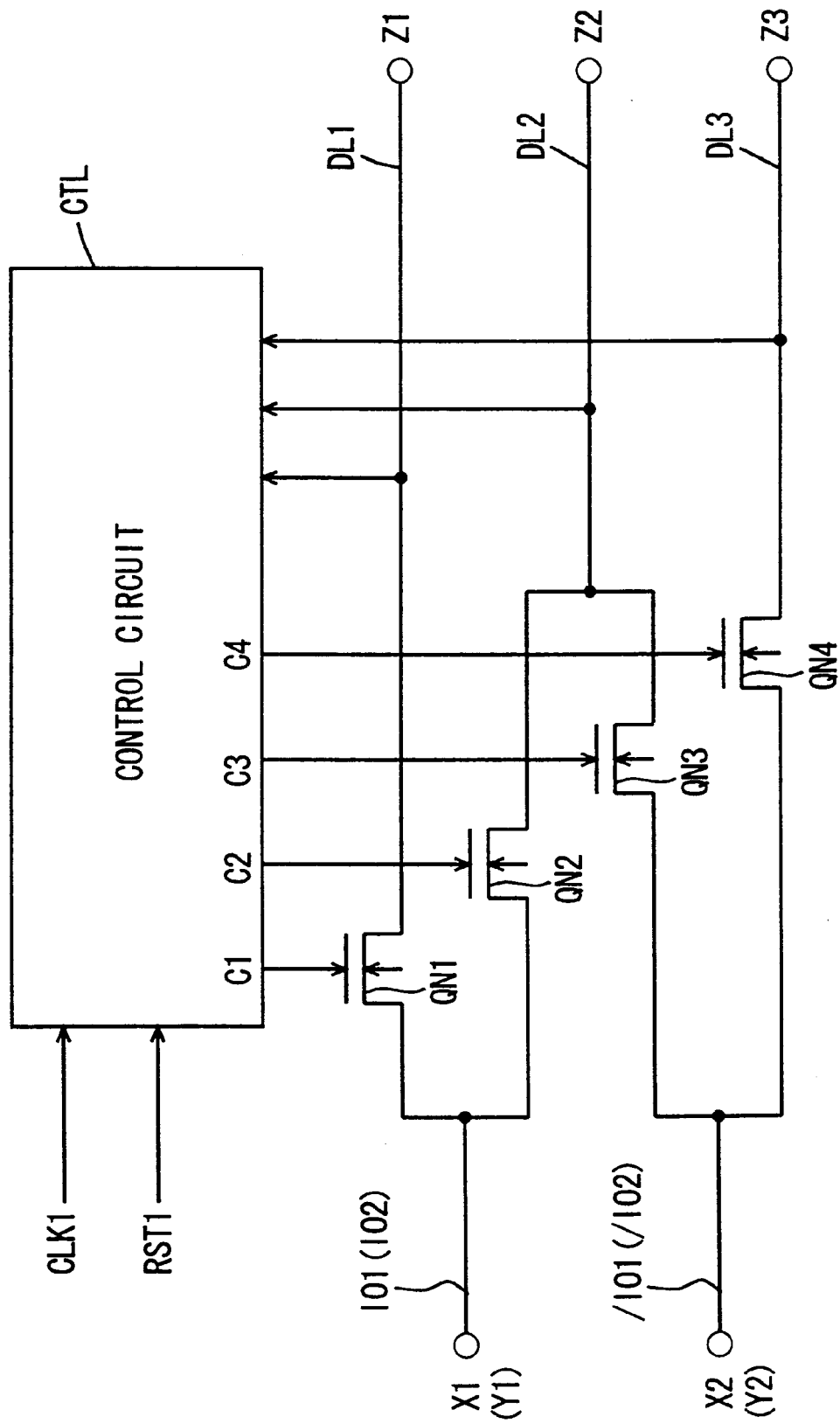
F I G. 2

FIG. 9
| | Z1 | Z2 | Z3 |
|---|---|---|---|
| RESET PERIOD | H | H | H |
| FIRST DATA TRANSFER PERIOD | H | H(KEEP) | L |
| SECOND DATA TRANSFER PERIOD | H | L | L(KEEP) |
| THIRD DATA TRANSFER PERIOD | H(KEEP) | H | L |
| . | . | . | . |
| . | . | . | . |
| . | . | . | . |
FIG. 10
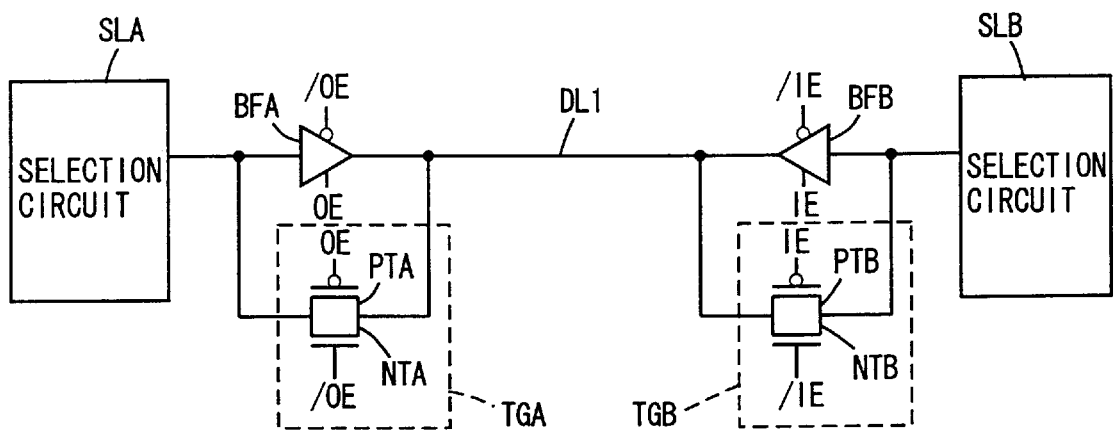
FIG. 11
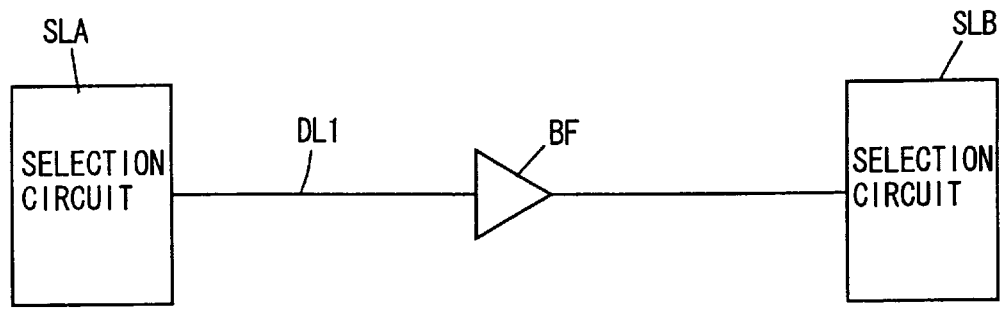

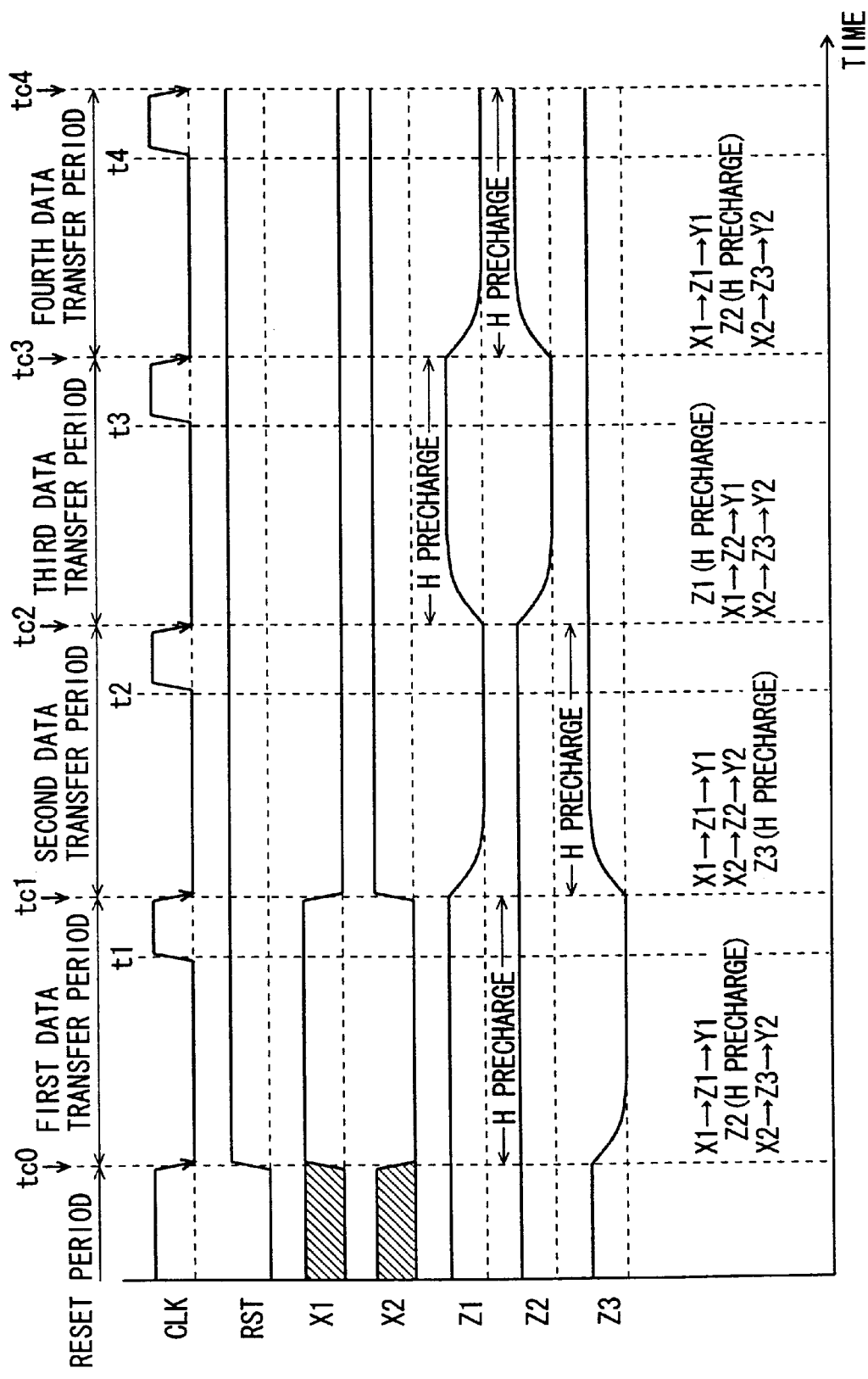

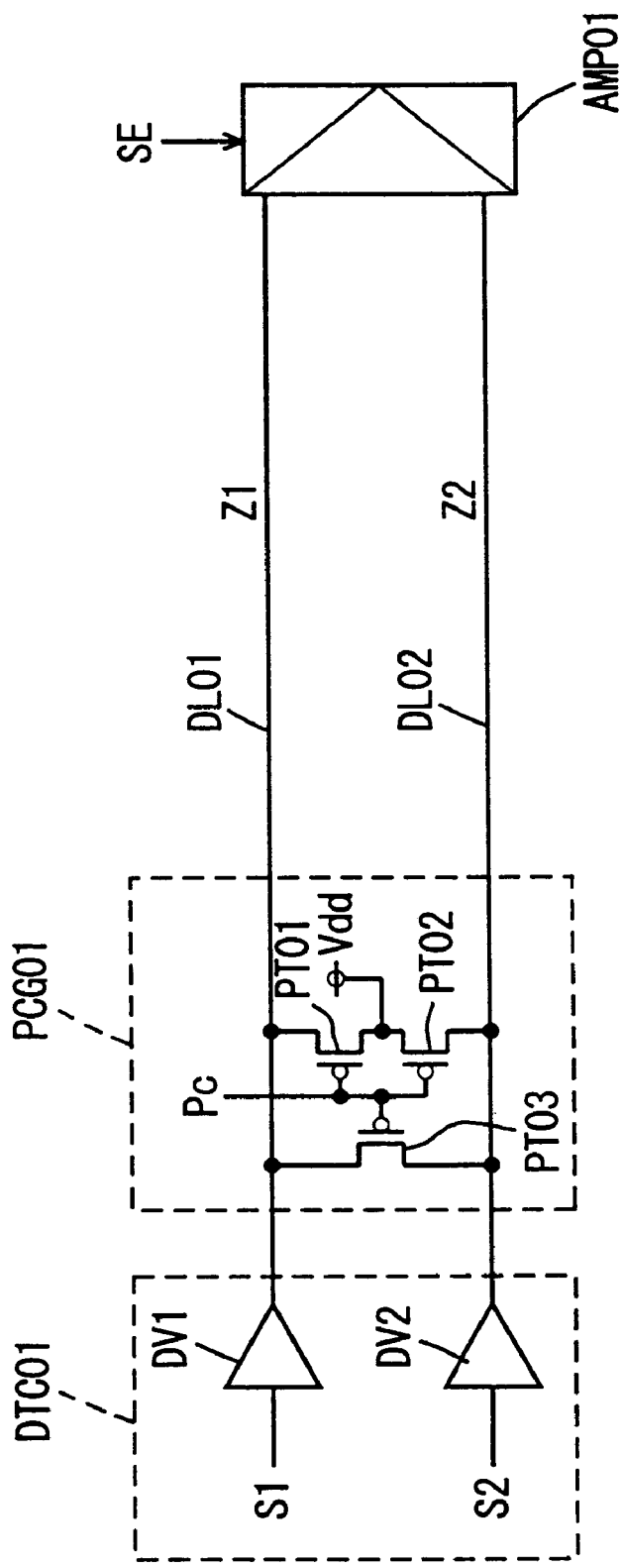
F I G. 2 6 PRIOR ART

DATA TRANSFER CIRCUIT TRANSFERRING COMPLEMENTARY DATA SIGNALS

BACKGROUND OF THE INVENTION

1. Field of the Invention

The present invention relates to a data transfer circuit, and more particularly, it relates to a data transfer circuit transferring complementary data signals through two signal transfer lines.

2. Description of the Prior Art

In order to transfer a data signal in a semiconductor device, a method of changing the voltage of a signal transfer line is widely employed. For example, a data signal is transferred by changing the voltage of a single signal transfer line. In this method, however, the receiving end for the signal cannot determine the transferred data signal until a voltage amplitude exceeding a noise level is obtained, due to an influence by a noise superposed on the signal transfer line.

In a data transfer method for preventing this problem, two signal transfer lines DL01 and DL02 are arranged substantially in parallel with each other and a differential amplifier AMP01 is provided for comparing the potentials of the two signal transfer lines DL01 and DL02 with each other and amplifying the potential difference therebetween for determining the data signal, as shown in FIG. 26. This method can cancel influences, which are substantially identical to each other, by noises superposed on the two signal transfer lines DL01 and DL02.

Operations of this circuit are now described with reference to FIG. 27. Referring to FIG. 27, symbols Z1 and Z2 denote the voltages of the signal transfer lines DL01 and DL02 respectively.

Before data transfer, i.e., before a time t1, a precharge signal Pc is at a low level, and hence a precharge circuit PCG01 formed by three P-channel MOS transistors PT01, PT02 and PT03 operates to precharge the signal transfer lines DL01 and DL02 at a voltage Vdd. At this time, drivers DV1 and DV2 output high-level signals.

At a time t1, the precharge signal Pc goes high and the precharge circuit PCG01 is inactivated, thereby enabling data transfer.

At a time t2, either one of the drivers DV1 and DV2 outputs a low-level signal in response to the data to be transferred. It is assumed here that a signal S1 is at a high level and the driver DV1 outputs a low-level signal. While the voltage Z1 of the signal transfer line DL01 responsively starts to change from a high level to a low level, this change of the voltage Z1 is retarded as shown in FIG. 27 if the signal transfer line DL01 has a large length, due to the wiring capacitance and resistance of the signal transfer line DL01.

At a time t3, the potential difference between the voltages Z1 and Z2 reaches a level allowing the differential amplifier AMP01 to detect and amplify signals, and a control signal SE goes high to drive the differential amplifier AMP01.

When the data transfer is completed, the signal transfer lines DL01 and DL02 are precharged at the voltage Vdd again to prepare for next data transfer.

The precharge voltage, which is assumed to be Vdd in the above example, may be set at Vdd, Vss or ½Vcc in response to the usage for employing a data transmission circuit, a differential amplifier and a precharge circuit responsive to the voltage. In any case, the voltages of the two signal transfer lines DL01 and DL02 are equal to each other immediately before transferring the data, but different from each other after the data transfer. After completion of the data transfer, therefore, the two signal transfer lines DL01 and DL02 must be precharged at the same voltage for transmitting next data. Thus, the next data cannot be transmitted between a time t4 for starting the precharge operation and a time t5 when the potential Z1 of the signal transfer line DL01 completely reaches the precharge voltage Vdd.

If the signal transfer lines DL01 and DL02 have large lengths, the wiring resistances and capacitances thereof are increased to further increase the time required for precharging. Thus, the data transfer rate is disadvantageously reduced.

SUMMARY OF THE INVENTION

An object of the present invention is to provide a data transfer circuit which can prevent reduction of a data transfer rate.

A data transfer circuit according to an aspect of the present invention includes first and second nodes, third and fourth nodes, first to third signal transfer lines and a selection circuit. The first and second nodes receive mutually complementary data signals. The third and fourth nodes transmit the mutually complementary data signals. The selection circuit is disposed to select a signal transfer line having the same potential as that of a precedently non-selected signal transfer line from two precedently selected signal transfer lines and the precedently non-selected signal transfer line among the first to third signal transfer lines and connects first ends thereof to the first and second nodes respectively while connecting second ends thereof to the third and fourth nodes respectively.

The aforementioned data transfer circuit presently transfers the mutually complementary data signals from the first and second nodes to the third and fourth nodes through the signal transfer line, selected from the two precedently selected signal transfer lines, having the same potential as that of the signal transfer line not precedently selected and the signal transfer line not precedently selected. At this time, the data transfer circuit may not precharge the two signal transfer lines presently selected from the first to third signal transfer lines for transferring the data signals, i.e., the signal transfer line, selected from the two precedently selected signal transfer lines, having the same potential as that of the signal transfer line not precedently selected and the signal transfer line not precedently selected for equalizing the potentials thereof with each other. Thus, the data transfer rate can be prevented from reduction resulting from increased lengths of the signal transfer lines.

A data transfer circuit according to another aspect of the present invention includes first and second nodes, third and fourth nodes, first to third signal transfer lines, a selection circuit and a precharge circuit. The first and second nodes receive mutually complementary data signals. The third and fourth nodes transmit the mutually complementary data signals. The selection circuit is disposed to select the second signal transfer line and a precedently non-selected one of the first and third signal transfer lines and connects first ends thereof to the first and second nodes respectively while connecting second ends thereof to the third and fourth nodes respectively. The precharge circuit is disposed to precharge the non-selected one of the first and third signal selection lines at the same potential as that of the second signal transfer line.

The aforementioned data transfer circuit presently transfers the mutually complementary data signals from the first and second nodes to the third and fourth nodes through the second signal transfer line and one of the first and third signal transfer lines not precedently selected. The signal transfer line not precedently selected has been precharged at the same potential as that of the second signal transfer line in transfer of preceding data signals. Consequently, the data transfer rate can be prevented from reduction.

A data transfer circuit according to still another aspect of the present invention includes first and second nodes receiving mutually complementary data signals, third and fourth nodes transmitting the mutually complementary data signals, first to fourth signal transfer lines, a first selection circuit, a second selection circuit, first to eighth connection circuits and first to fourth precharge circuits.

The first selection circuit is disposed to alternately select the first and second signal transfer lines and the third and fourth signal transfer lines in response to a clock signal and connect first ends of the selected two signal transfer lines to the first and second nodes respectively. The second selection circuit is disposed to connect second ends of the two signal transfer lines selected by the first selection circuit to the third and fourth nodes respectively.

The first connection circuit is disposed to connect the first signal transfer line and the third signal transfer line with each other when the third signal transfer line has precedently been at a logical low level and the first signal transfer line presently transfers a signal of a logical low level. The second connection circuit is disposed to connect the first signal transfer line and the third signal transfer line with each other when the first signal transfer line has precedently been at a logical low level and the third signal transfer line presently transfers a signal of a logical low level. The third connection circuit is disposed to connect the first signal transfer line and the fourth signal transfer line with each other when the fourth signal transfer line has precedently been at a logical low level and the first signal transfer line presently transfers a signal of a logical low level. The fourth connection circuit is disposed to connect the first signal transfer line and the fourth signal transfer line with each other when the first signal transfer line has precedently been at a logical low level and the fourth signal transfer line presently transfers a signal of a logical low level. The fifth connection circuit is disposed to connect the second signal transfer line and the third signal transfer line with each other when the third signal transfer line has precedently been at a logical low level and the second signal transfer line presently transfers a signal of a logical low level. The sixth connection circuit is disposed to connect the second signal transfer line and the third signal transfer line with each other when the second signal transfer line has precedently been at a logical low level and the third signal transfer line presently transfers a signal of a logical low level. The seventh connection circuit is disposed to connect the second signal transfer line and the fourth signal transfer line with each other when the fourth signal transfer line has precedently been at a logical low level and the second signal transfer line presently transfers a signal of a logical low level. The eighth connection circuit is disposed to connect the second signal transfer line and the fourth signal transfer line with each other when the second signal transfer line has precedently been at a logical low level and the fourth signal transfer line presently transfers a signal of a logical low level.

The first precharge circuit is disposed to precharge the first signal transfer line at a logical high level after a lapse of a prescribed time from connection by the second or fourth connection circuit. The second precharge circuit is disposed to precharge the second signal transfer line at a logical high level after a lapse of a prescribed time from connection by the sixth or eighth connection circuit. The third precharge circuit is disposed to precharge the third signal transfer line at a logical high level after a lapse of a prescribed time from connection by the first or fifth connection circuit. The fourth precharge circuit is disposed to precharge the fourth signal transfer line at a logical high level after a lapse of a prescribed time from connection by the third or seventh connection circuit.

The aforementioned data transfer circuit connects one of two precedently selected signal transfer lines having transferred a data signal of a logical low level with one of presently selected two signal transfer lines transferring a data signal of a logical low level by the corresponding connection circuit. Thus, the data transfer circuit supplies charges of the one of the presently selected two signal transfer lines transferring the data signal of a logical low level to the one of the precedently selected two signal transfer lines having transferred the data signal of a logical low level. Consequently, the voltage of the one of the presently selected two signal transfer lines transferring the data signal of a logical low level is lower than a logical high level, while the voltage of the one of the precedently selected two signal transfer lines having transferred the data signal of a logical low level is higher than the logical low level. Thus, power consumed for precharging the one of the precedently selected two signal transfer lines having transferred the data signal of a logical low level can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram showing the overall structure of a selection circuit shown in FIG. 1;

FIG. 9 illustrates voltages of signal transfer lines during a data transfer period;

FIGS. 10 and 11 are block diagrams showing the structures of buffers provided on each signal transfer line;

FIG. 14 is a timing chart for illustrating the operations of the DRAM according to the embodiment 2 of the present invention;

FIG. 26 is a block diagram showing the structure of a data transfer circuit for determining data signals by comparing potentials of two signal transfer lines with each other.

DESCRIPTION OF THE PREFERRED EMBODIMENTS

Figure 1:
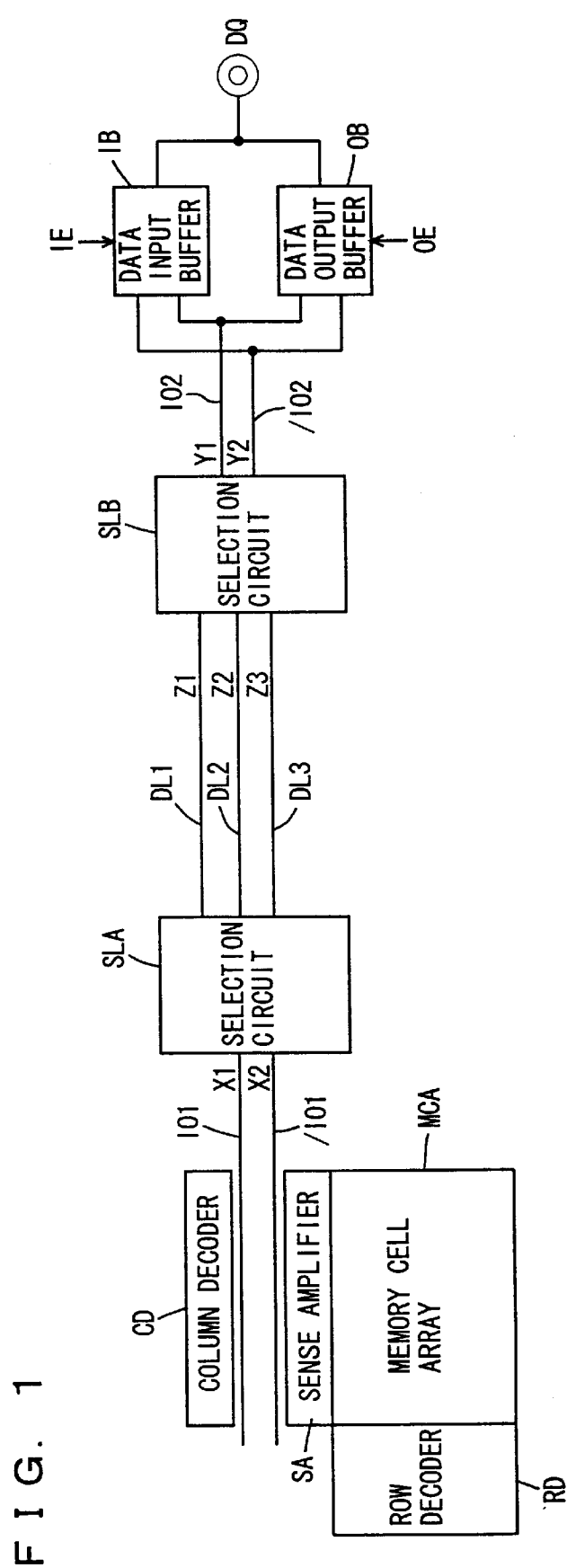
FIG. 1 is a block diagram showing the overall structure of a DRAM to which a data transfer circuit according to an embodiment 1 of the present invention is applied.

Embodiments of the present invention are now described in detail with reference to the drawings. Referring to the drawings, parts identical or corresponding to each other are denoted by the same reference numerals, to omit redundant description.

[Embodiment 1]

FIG. 1 is a block diagram showing the overall structure of a DRAM to which a data transfer circuit according to an embodiment 1 of the present invention is applied. Referring to FIG. 1, this DRAM includes a memory cell array MCA, a row decoder RD, a column decoder CD, a sense amplifiers SA, input/output lines IO1,/IO1, IO2 and /IO2, selection circuits SLA and SLB, signal transfer lines DL1 to DL3, a data input buffer IB, a data output buffer OB and a data input/output pin DQ. The input/output lines IO1,/IO1, IO2 and /IO2, the selection circuits SLA and SLB and the signal transfer lines DL1 to DL3 form the data transfer circuit.

The memory cell array MCA includes a plurality of memory cells (not shown) arranged in rows and columns, a plurality of word lines (not shown) arranged on the rows and a plurality of pairs of bit lines (not shown) arranged on the columns. The row decoder RD selectively activates any word line in response to a row address signal. The column decoder CD selects any pair of bit lines in response to a column address signal. The sense amplifier SA amplifies data signals read on the pair of bit lines from any memory cell (not shown) provided in the memory cell array MCA. The input/output lines IO1 and /IO1 transfer mutually complementary data signals. Similarly, the input/output lines IO2 and /IO2 transfer mutually complementary data signals. The selection circuit SLA selects a signal transfer line having the same potential as that of a signal transfer line not precedently selected from two of the signal transfer lines DL1 to DL3 selected for precedent data transfer and the signal transfer line not precedently selected and connects first ends thereof to the input/output lines IO1 and /IO1 respectively. The selection circuit SLB selects the signal transfer line having the same potential as that of the signal transfer line not precedently selected from the two of the signal transfer lines DL1 to DL3 selected for the precedent data transfer and the signal transfer line not precedently selected and connects second ends thereof to the input/output lines IO2 and /IO2 respectively. The data input buffer IB outputs an external data signal from the data input/output pin DQ to the input/output lines IO2 and /IO2 in response to an activation signal IE. The data output buffer OB outputs the data signals from the input/output lines IO2 and /IO2 to the data input/output pin DQ in response to an activation signal OE.

FIG. 2 is a block diagram showing the overall structure of the selection circuit SLA shown in FIG. 1. Referring to FIG. 2, the selection circuit SLA includes a control circuit CTL and N-channel MOS transistors QN1 to QN4.

The control circuit CTL generates control signals C1 to C4 in response to the voltages of a clock signal CLK1, a reset signal RST1 and the signal transfer lines DL1 to DL3. The N-channel MOS transistor QN1 is connected between the input/output line IO1 and the signal transfer line DL1 and turned on/off in response to the control signal C1. The N-channel MOS transistor QN2 is connected between the input/output line IO1 and the signal transfer line DL2 and turned on/off in response to the control signal C2. The N-channel MOS transistor QN3 is connected between the input/output line /IO1 and the signal transfer line DL2 and turned on/off in response to the control signal C3. The N-channel MOS transistor QN4 is connected between the input/output line /IO1 and the signal transfer line DL3 and turned on/off in response to the control signal C4.

The selection circuit SLB is identical in structure to the selection circuit SLA, except that the same includes the input/output lines IO2 and /IO2 in place of the input/output lines IO1 and /IO1 shown in FIG. 2.

Figure 3:
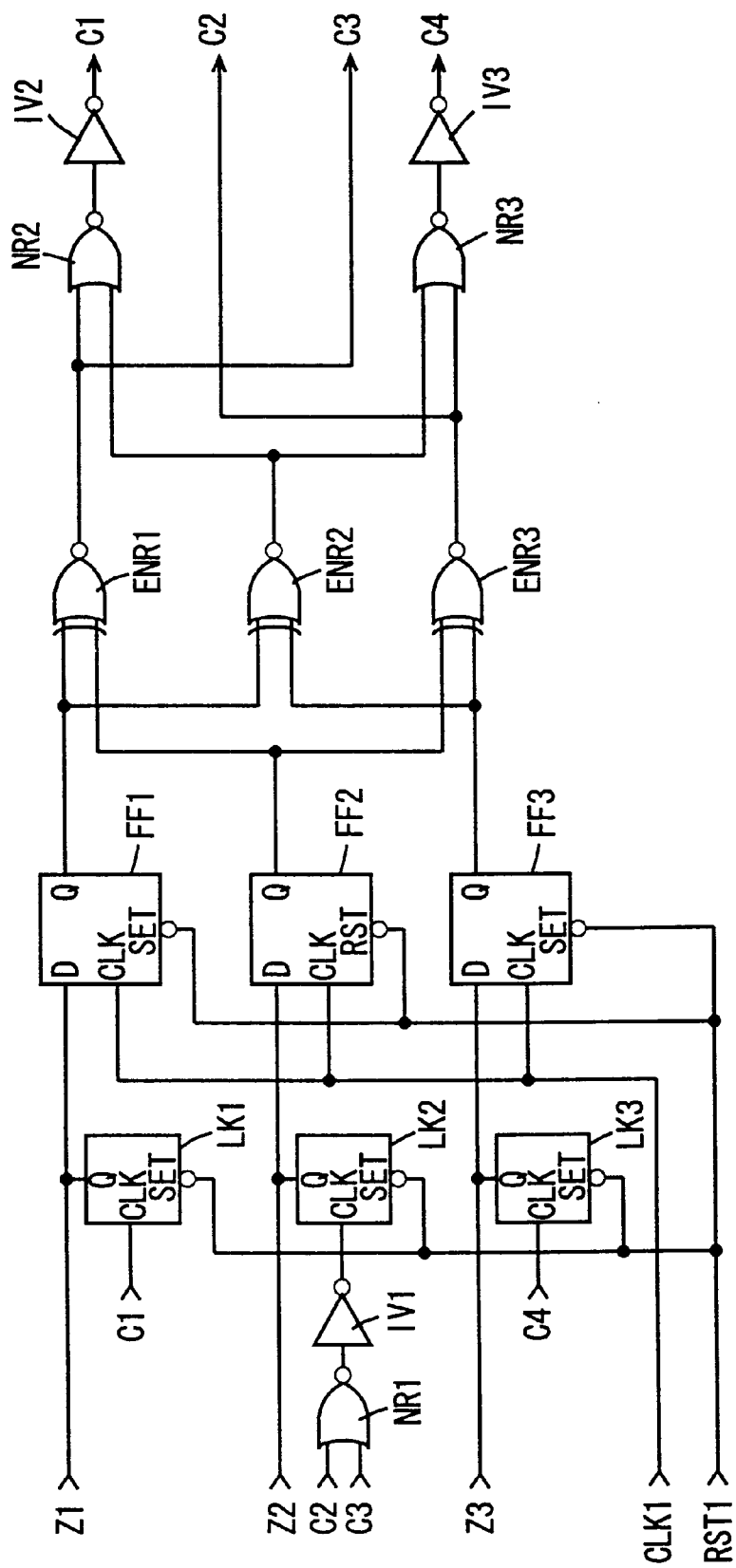
FIG. 3 is a block diagram showing the structure of a control circuit shown in FIG. 2.

FIG. 3 is a block diagram showing the structure of the control circuit CTL shown in FIG. 2. Referring to FIG. 3, the control circuit CTL includes invertors IV1 to IV3, NOR circuits NR1 to NR3, EX-NOR (exclusive NOR) circuits ENR1 to ENR3, flip-flop circuits FF1 to FF3 and level keep circuits LK1 to LK3. The NOR circuit NR1 outputs the NOR of the control signals C2 and C3. The invertor IV1 inverts the output from the NOR circuit NR1.

The level keep circuit LK1 receives the control signal C1 in a clock input CLK while receiving a reset signal RST1 in a set input SET, and keeps the voltage Z1 of the signal transfer line DL1 when the control signal C1 is at a low level. The level keep circuit LK2 receives an output of the invertor IV1 in a clock input CLK while receiving the reset signal RST1 in a set input SET, and keeps the voltage Z2 of the signal transfer line DL2 when the output of the invertor IV1 is at a low level. The level keep circuit LK3 receives the control signal C4 in a clock input CLK while receiving the reset signal RST1 in a set input SET, and keeps the voltage Z3 of the signal transfer line DL3 when the control signal C4 is at a low level.

The flip-flop circuit FF1 keeps the voltage Z1 of the signal transfer line DL1 received in an input D for a prescribed time and thereafter outputs the same in response to the clock signal CLK1 received in a clock input CLK and the reset signal RST1 received in a set input SET. The flip-flop circuit FF2 keeps the voltage Z2 of the signal transfer line DL2 received in an input D for a prescribed time and thereafter outputs the same in response to the clock signal CLK1 received in a clock input CLK and the reset signal RST1 received in a reset input RST. The flip-flop circuit FF3 keeps the voltage Z3 of the signal transfer line DL3 received in an input D for a prescribed time and thereafter outputs the same in response to the clock signal CLK1 received in a clock input CLK and the reset signal RST1 received in a set input SET.

The EX-NOR circuit ENR1 outputs the EX-NOR of the output from the flip-flop circuit FF1 and that from the flip-flop circuit FF2. The output from the EX-NOR circuit ENR1 forms the control signal C3. The EX-NOR circuit ENR2 outputs the EX-NOR of the output from the flip-flop circuit FF1 and that from the flip-flop circuit FF3. The EX-NOR circuit ENR3 outputs the EX-NOR of the output from the flip-flop circuit FF2 and that from the flip-flop circuit FF3. The output from the EX-NOR circuit ENR3 forms the control signal C2. The NOR circuit NR2 outputs the NOR of the outputs from the EX-NOR circuit ENR1 and the EX-NOR circuit ENR2. The NOR circuit NR3 outputs the NOR of the outputs from the EX-NOR circuit ENR2 and the EX-NOR circuit ENR3. The invertor IV2 inverts the output from the NOR circuit NR2. An output from the invertor IV2 forms the control signal C1. The invertor IV3 inverts the output from the NOR circuit NR3. An output from the invertor IV3 forms the control signal C4.

Figure 4:
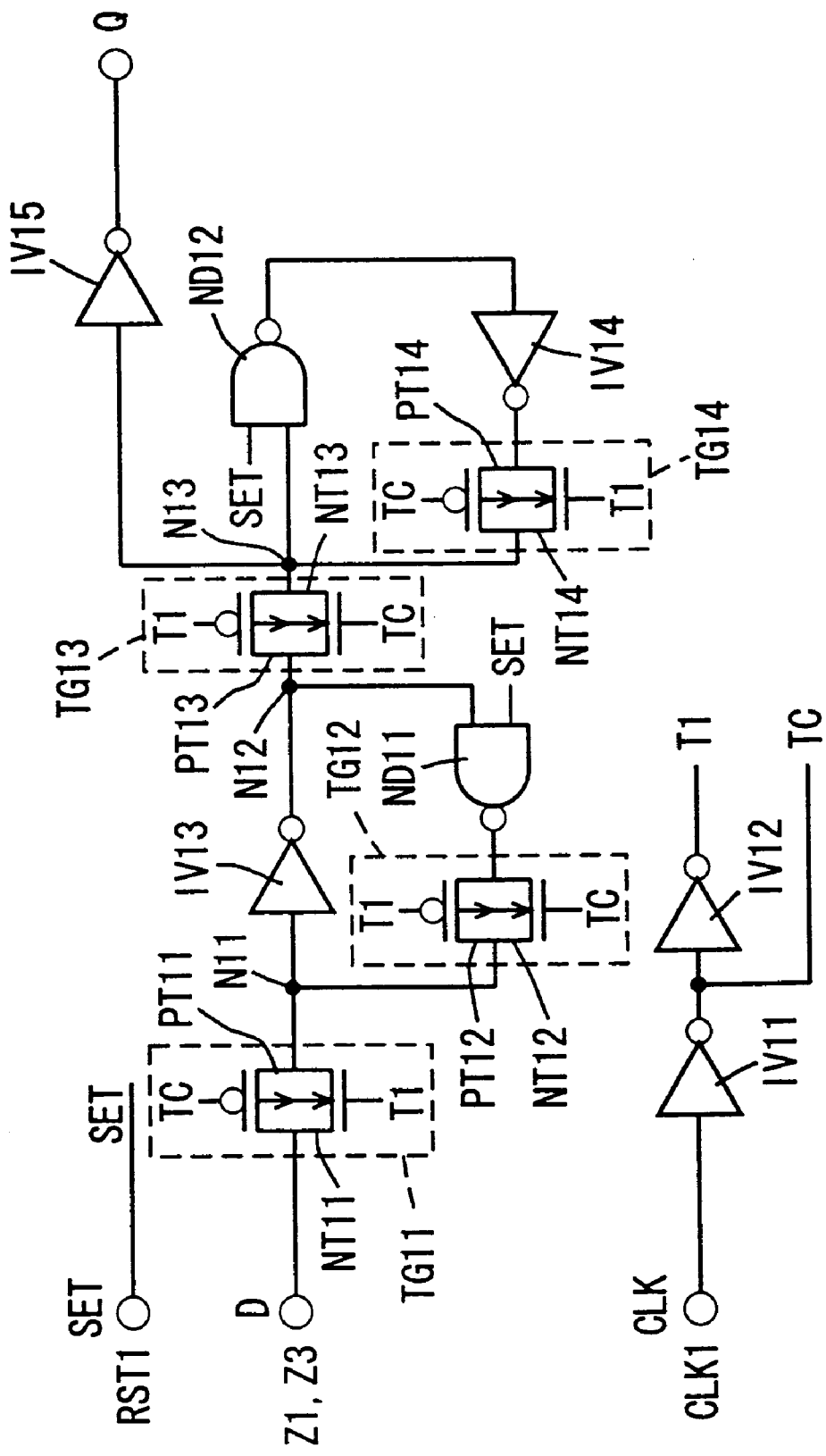
FIGS. 4 and 5 are block diagrams showing the structures of flip-flop circuits shown in FIG. 3.

FIG. 4 is a block diagram showing the structure of each of the flip-flop circuits FF1 and FF3 shown in FIG. 3. Referring to FIG. 4, each of the flip-flop circuits FF1 and FF3 includes invertors IV11 to IV15, transfer gates TG11 to TG14 and NAND circuits ND11 and ND12.

The reset signal RST1 supplied to the set input SET is inputted in the NAND circuits ND11 and ND12 as a set signal SET. The invertor IV11 inverts the clock signal CLK1 supplied to the clock input CLK. An output from the invertor IV11 forms a control signal TC. The invertor IV12 inverts the output from the invertor IV11. An output from the invertor IV12 forms a control signal T1.

The transfer gate TG11 includes a P-channel MOS transistor PT11 and an N-channel MOS transistor NT11. The P-channel MOS transistor PT11 is connected between the input D and a node N11 and turned on/off in response to the control signal TC. The N-channel MOS transistor NT11 is connected between the input D and the node N11 in parallel with the P-channel MOS transistor PT11 and turned on/off in response to the control signal T1.

The transfer gate TG12 includes a P-channel MOS transistor PT12 and an N-channel MOS transistor NT12. The P-channel MOS transistor PT12 is connected between the node N11 and the output of the NAND circuit ND11 and turned on/off in response to the control signal T1. The N-channel MOS transistor NT12 is connected between the node N11 and the output of the NAND circuit ND11 in parallel with the P-channel MOS transistor PT12 and turned on/off in response to the control signal TC.

The transfer gate TG13 includes a P-channel MOS transistor PT13 and an N-channel MOS transistor NT13. The P-channel MOS transistor PT13 is connected between nodes N12 and N13 and turned on/off in response to the control signal T1. The N-channel MOS transistor NT13 is connected between the nodes N12 and N13 in parallel with the P-channel MOS transistor PT13 and turned on/off in response to the control signal TC.

The transfer gate TG14 includes a P-channel MOS transistor PT14 and an N-channel MOS transistor NT14. The P-channel MOS transistor PT14 is connected between the node N13 and an output of the invertor IV14 and turned on/off in response to the control signal TC. The N-channel MOS transistor NT14 is connected between the node N13 and the output of the invertor IV14 in parallel with the P-channel MOS transistor PT14 and turned on/off in response to the control signal T1.

The invertor IV13 inverts the voltage of the node N11. The NAND circuit ND11 outputs the NAND of the voltage of the node N12 and the set signal SET. The NAND circuit ND12 outputs the NAND of the voltage of the node N13 and the set signal SET. The invertor IV14 inverts the output of the NAND circuit ND12. The invertor IV15 inverts the voltage of the node N13. An output of the invertor IV15 forms an output Q of each of the flip-flop circuits FF1 and FF3.

Operations of each of the flip-flop circuits FF1 and FF3 having the aforementioned structure are now described with reference to the reset signal RST1, supplied to the set input SET, at a low level and a high level respectively.

(1) When the reset signal RST1 is at a low level:

At this time, the set signal SET goes low and the outputs of the NAND circuits ND11 and ND12 receiving the same go high.

When the clock signal CLK1 supplied to the clock input CLK is at a low level, the control signals T1 and TC go low and high respectively. Thus, the transfer gates TG11 and TG14 are turned off while the transfer gates TG12 and TG13 are turned on. Consequently, the invertors IV13 and IV15 invert the high-level output of the NAND circuit ND11, and the output Q of each of the flip-flop circuits FF1 and FF3 goes high.

When the clock signal CLK1 supplied to the clock input CLK is at a high level, the control signals T1 and TC go high and low respectively. Thus, the transfer gates TG11 and TG14 are turned on while the transfer gates TG12 and TG13 are turned off. Consequently, the invertors IV14 and IV15 invert the high-level output of the NAND circuit ND12 and the output Q of each of the flip-flop circuits FF1 and FF3 goes high. The invertor IV13 inverts the voltage of the input D and supplies the same to the node N12.

As hereinabove described, the output Q of each of the flip-flop circuits FF1 and FF3 goes high when the reset signal RST1 is at a low level, regardless of the clock signal CLK1.

(2) When the reset signal RST1 is at a high level:

At this time, the set signal SET goes high, and the NAND circuit ND11 receiving the same is equivalent to an invertor inverting and outputting the voltage of the node N12 while the NAND circuit ND12 is equivalent to an invertor inverting and outputting the voltage of the node N13.

When the clock signal CLK1 supplied to the clock input CLK is at a high level, the control signals T1 and TC go high and low respectively. Thus, the transfer gates TG11 and TG14 are turned on while the transfer gates TG12 and TG13 are turned off. Consequently, the voltage of node N13 is inverted by the invertor IV15 and outputted from the output Q. Further, the voltage of the node ND12 is kept by a latch circuit formed by the NAND circuit ND12 and the invertor IV14. On the other hand, the voltage of the input D is inverted by the invertor IV13 and supplied to the node N12.

When the clock signal CLK1 changes from the high level to a low level, the control signals T1 and TC go low and high respectively, the transfer gates TG11 and TG14 are turned off, and the transfer gates TG12 and TG13 are turned on. Consequently, the voltage of the node N12 is inverted by the invertor IV15 and outputted from the output Q. Further, the voltage of the node N12 is kept by a latch circuit formed by the NAND circuit ND 11 and the invertor IV13.

When the clock signal CLK1 further changes from the low level to a high level, the control signals T1 and TC go high and low respectively, the transfer gates TG11 and TG14 are turned on and the transfer gates TG12 and TG13 are turned off. Consequently, the voltage of the input D is inverted by the invertor IV13 and supplied to the node N12. On the other hand, the voltage of the node N13 is kept by the latch circuit formed by the NAND circuit ND12 and the invertor IV14, inverted by the invertor IV15 and outputted from the output Q.

Figure 5:
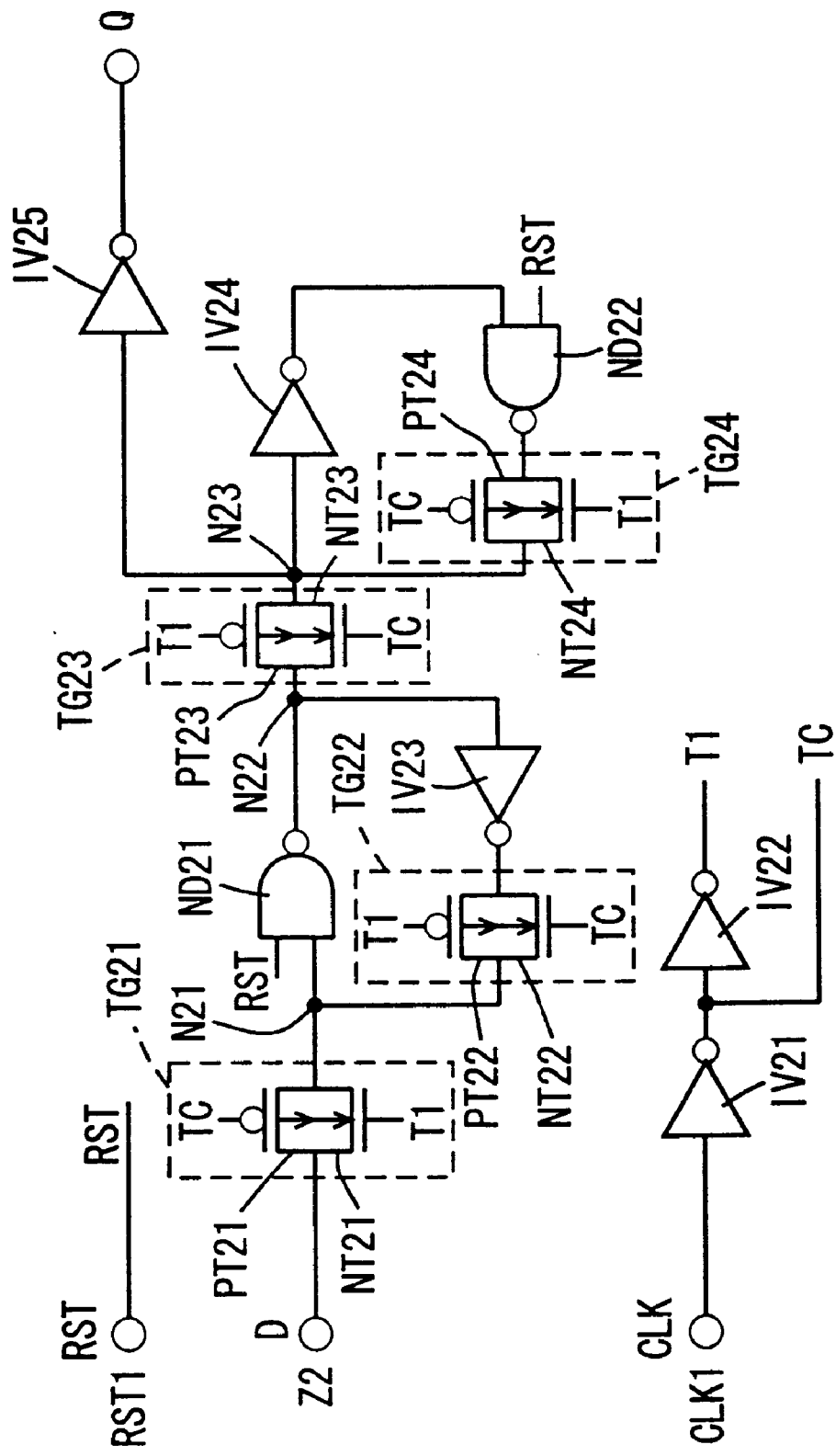

FIG. 5 is a block diagram showing the structure of the flip-flop circuit FF2 shown in FIG. 3. Referring to FIG. 5, the flip-flop circuit FF2 includes invertors IV21 to IV25, transfer gates TG21 to TG24 and NAND circuits ND21 and ND22.

The reset signal RST1 supplied to the reset input RST is supplied to the NAND circuits ND21 and ND22 as the reset signal RST. The invertor IV21 inverts the clock signal CLK1 supplied to the clock input CLK. An output from the invertor IV21 forms a control signal TC. The invertor IV22 inverts the output from the invertor IV21. An output from the invertor IV22 forms a control signal T1.

The transfer gate TG21 includes a P-channel MOS transistor PT21 and an N-channel MOS transistor NT21. The P-channel MOS transistor PT21 is connected between the input D and a node N21 and turned on/off in response to the control signal TC. The N-channel MOS transistor NT21 is connected between the input D and the node N21 in parallel with the P-channel MOS transistor PT21 and turned on/off in response to the control signal T1.

The transfer gate TG22 includes a P-channel MOS transistor PT22 and an N-channel MOS transistor NT22. The P-channel MOS transistor PT22 is connected between the node N21 and an output of the invertor IV23 and turned on/off in response to the control signal T1. The N-channel MOS transistor NT22 is connected between the node N21 and the output of the invertor IV23 in parallel with the P-channel MOS transistor PT22 and turned on/off in response to the control signal TC.

The transfer gate TG23 includes a P-channel MOS transistor PT23 and an N-channel MOS transistor NT23. The P-channel MOS transistor PT23 is connected between nodes N22 and N23 and turned on/off in response to the control signal T1. The N-channel MOS transistor NT23 is connected between the nodes N22 and N23 in parallel with the P-channel MOS transistor PT23 and turned on/off in response to the control signal TC.

The transfer gate TG24 includes a P-channel MOS transistor PT24 and an N-channel MOS transistor NT24. The P-channel MOS transistor PT24 is connected between the node N23 and an output of the NAND circuit ND22 and turned on/off in response to the control signal TC. The N-channel MOS transistor NT24 is connected between the node N23 and the output of the NAND circuit ND22 in parallel with the P-channel MOS transistor PT24 and turned on/off in response to the control signal T1.

The invertor NV23 inverts the voltage of the node N22. The NAND circuit ND21 outputs the NAND of the voltage of the node N21 and the reset signal RST. The NAND circuit ND22 outputs the NAND of the output of the invertor IV24 and the reset signal RST. The invertor IV24 inverts the voltage of the node N23. The invertor IV25 inverts the voltage of the node N23. An output of the invertor IV25 forms an output Q of the flip-flop circuit FF2.

Operations of the flip-flop circuit FF2 having the aforementioned structure are now described with reference to the reset signal RST1, supplied to the reset input RST, at a low level and a high level respectively.

(1) When the reset signal RST1 is at a low level:

At this time, the reset signal RST goes low, and the outputs of the NAND circuits ND21 and ND22 receiving the same go high.

When the clock signal CLK1 supplied to the clock input CLK is at a low level, the control signals T1 and TC go low and high respectively. Thus, the transfer gates TG21 and TG24 are turned off while the transfer gates TG22 and TG23 are turned on. Consequently, the invertor IV25 inverts the high-level output of the NAND circuit ND21, and the output Q of the flip-flop circuit FF2 goes low.

When the clock signal CLK1 supplied to the clock input CLK is at a high level, the control signals T1 and TC go high and low respectively. Thus, the transfer gates TG21 and TG24 are turned on while the transfer gates TG22 and TG23 are turned off. Consequently, the invertor IV25 inverts the high-level output of the NAND circuit ND22, and the output Q of the flip-flop circuit FF2 goes low.

As hereinabove described, the output Q of the flip-flop circuit FF2 goes low when the reset signal RST1 is at a low level, regardless of the clock signal CLK1.

(2) When the reset signal RST1 is at a high level:

At this time, the reset signal RST goes high, and the NAND circuit ND21 receiving the same is equivalent to an invertor inverting and outputting the voltage of the node N21 while the NAND circuit ND22 is equivalent to an invertor inverting and outputting the output of the invertor IV24. Thus, the flip-flop circuit FF2 operates similarly to each of the flip-flop circuits FF1 and FF3 shown in FIG. 4.

Figure 6:
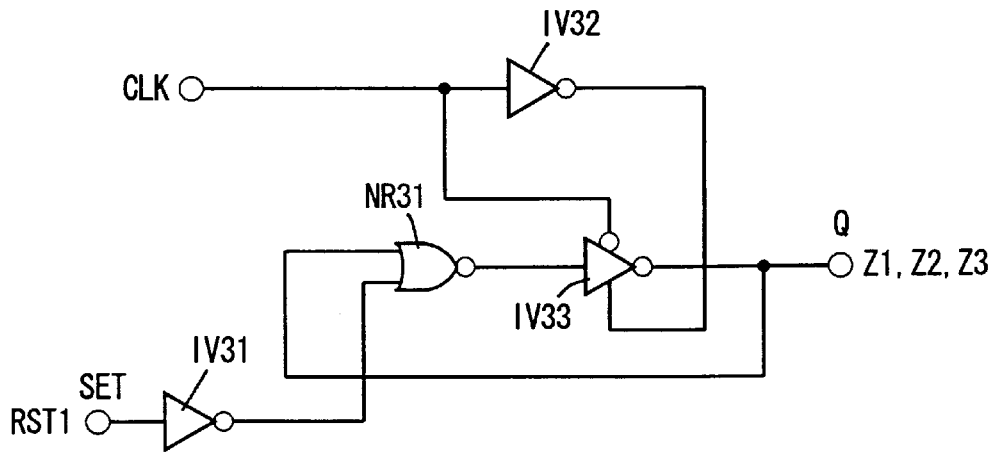
FIG. 6 is a block diagram showing the structure of a level keep circuit shown in FIG. 3.

FIG. 6 is a block diagram showing the structure of each of the level keep circuit LK1 to LK3 shown in FIG. 3. Referring to FIG. 6, each of the level keep circuits LK1 to LK3 includes invertors IV31 to IV33 and a NOR circuit NR31.

The invertor IV31 inverts the reset signal RST1 supplied to the set input SET. The NOR circuit NR31 outputs the NOR of outputs of the invertors IV31 and IV33. The invertor IV32 inverts a signal (the control signal C1 in the level keep circuit LK1, the output of the invertor IV1 in the level keep circuit LK2 or the control signal C4 in the level keep circuit LK3) supplied to the clock input CLK. The invertor IV33 is activated in response to the signal supplied to the clock input CLK and an output from the invertor IV32 and inverts the output of the NOR circuit NR31. When the output from the invertor IV31 is at a low level, the NOR circuit NR31 and the invertor IV33 form a latch circuit for keeping the values of the voltages Z1, Z2 and Z3 supplied to the output Q.

Figure 7:
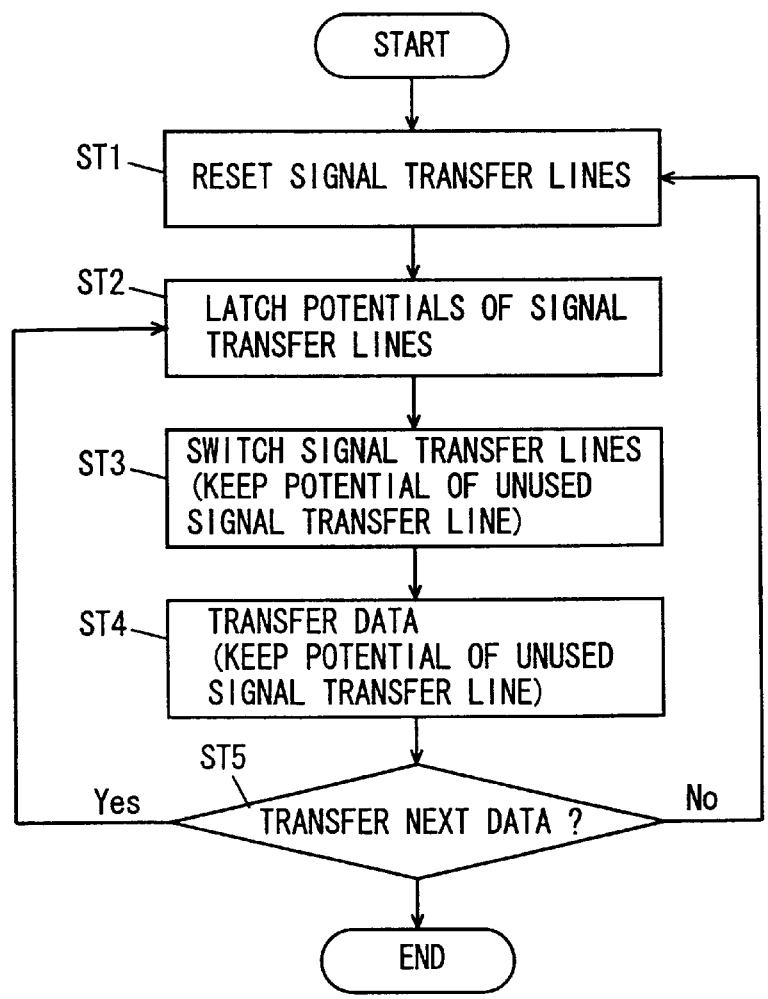
FIG. 7 is a flow chart for illustrating schematic operations of the DRAM shown in FIG. 1.

Schematic operations of the DRAM having the aforementioned structure are now described with reference to a flow chart shown in FIG. 7.

First, the DRAM precharges the signal transfer lines DL1 to DL3 at high levels at a step ST1.

Then, the DRAM latches the voltages Z1 to Z3 of the signal transfer lines DL1 to DL3 at a step ST2.

Then, the DRAM compares the voltages Z1 to Z3 of the signal transfer lines DL1 to DL3 latched at the step ST2 with each other at a step ST3, selects two signal transfer lines (assumed to be the signal transfer lines DL1 and DL3 here) having equal voltages and connects first ends thereof to the input/output lines IO1 and /IO1 respectively while connecting second ends thereof to the input/output lines IO2 and /IO2 respectively. The level keep circuit LK2 keeps the voltage Z2 of the remaining signal transfer line DL2.

Then, the DRAM transfers data at a step ST4. When reading data signals from any memory cell provided in the memory cell array MCA, the sense amplifier SA amplifies the data signals from the memory cell and transfers the same to the input/output lines IO1 and /IO1. Further, the data signals are transferred from the input/output lines IO1 and /IO1 to the input/output lines IO2 and /IO2 through the signal transfer lines DL1 and DL3. The data output buffer OB amplifies the data signals transferred to the input/output lines IO2 and /IO2 and thereafter outputs the same to the data input/output pin DQ. Also during the data transfer, the level keep circuit LK2 keeps the voltage Z2 of the remaining signal transfer line DL2.

Then, the DRAM determines whether or not next data is to be transferred at a step ST5. The process returns to the step ST2 when the determination is of yes. When the determination is of no, the process returns to the step ST1.

Figure 8:
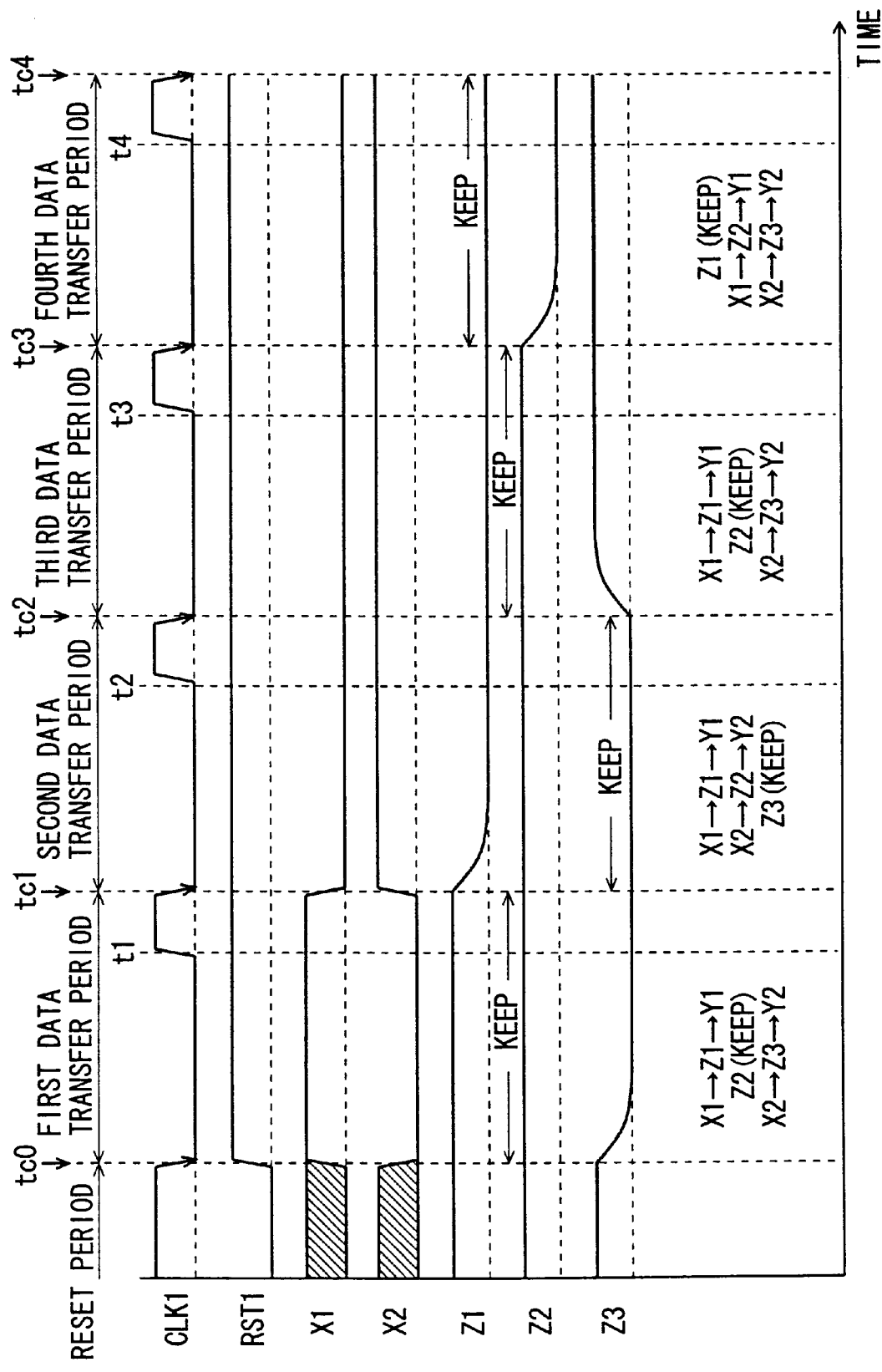
FIG. 8 is a timing chart for illustrating the operations of the DRAM shown in FIG. 1.

Operations of the DRAM according to the embodiment 1 for reading data signals from any memory cell of the memory cell array MCA are now described with reference to FIG. 8.

(0) Reset Period (before time tc0)

The DRAM precharges the voltages Z1 to Z3 of the signal transfer lines DL1 to DL3 at high levels. The clock signal CLK1 is at a high level, and the reset signal RST1 is at a low level. Thus, the transfer gates TG11 and TG14 are turned on and the transfer gates TG12 and TG13 are turned off in each the flip-flop circuits FF1 and FF3 shown in FIG. 4, and hence the output Q goes high and the node N12 goes low. Further, the transfer gates TG21 and TG24 are turned on and the transfer gates TG22 and TG23 are turned off in the flip-flop circuit FF2 shown in FIG. 5, and hence the output Q goes low and the node N22 goes high.

(1) First Data Transfer Period (from time tc0 to time tc1)

The clock signal CLK1 falls to a low level at the time tc0.

In response to this, the data signals from the memory cell selected by the row decoder RD and the column decoder CD shown in FIG. 1 are read on the input/output lines IO1 and /IO1 as complementary data signals through the sense amplifier SA. It is assumed here that symbols X1 and X2 denote the voltages of the input/output lines IO1 and /IO1 respectively. It is also assumed that the voltage X1 is at a high level and the voltage X2 is at a low level.

In response to the fall of the clock signal CLK1, the transfer gates TG11 and TG14 are turned off and the transfer gates TG12 and TG13 are turned on in each of the flip-flop circuits FF1 and FF3 shown in FIG. 4. Thus, the invertor IV15 inverts the low-level voltage of the node N12 and the output Q goes high. The latch circuit formed by the invertor IV13 and the NAND circuit ND11 keeps the node N12 at the low level. In the flip-flop circuit FF2 shown in FIG. 5, the transfer gates TG21 and TG24 are turned off and the transfer gates TG22 and TG23 are turned on. Thus, the invertor IV25 inverts the high-level voltage of the node N22 and the output Q goes low. The latch circuit formed by the invertor IV23 and the NAND circuit ND21 keeps the node N22 at the high level.

Referring again to FIG. 3, the control signals C1 and C4 go high and the control signals C2 and C3 go low through the outputs Q from the flip-flop circuits FF1 to FF3.

In response to the control signals C1 to C4, the NMOS transistors QN1 and QN4 shown in FIG. 2 are turned on while the NMOS transistors QN2 and QN3 are turned off.

Consequently, the N-channel MOS transistor QN1 of the selection circuit SLA connects the first end of the signal transfer line DL1 to the input/output line IO1, and the N-channel MOS transistor QN1 of the selection circuit SLB connects the second end of the signal transfer line DL1 to the input/output line IO2. Further, the N-channel MOS transistor QN4 of the selection circuit SLA connects the first end of the signal transfer line DL3 to the input/output line /IO1, and the N-channel MOS transistor QN4 of the selection circuit SLB connects the second end of the signal transfer line DL3 to the input/output line /IO2. The signal transfer line DL2 is connected with none of the input/output lines IO1, /IO1, IO2 and /IO2.

Thus, the signal transfer lines DL1 and DL3 transfer the data signals on the input/output lines IO1 and /IO1 to the input/output lines IO2 and /IO2 respectively. Thus, the voltage Z1 of the signal transfer line DL1 goes high and the voltage Z3 of the signal transfer line DL3 goes low. It is assumed that symbols Y1 and Y2 denote the voltages of the input/output lines IO2 and /IO2 respectively. Receiving the transferred data signals, the voltage Y1 goes high and the voltage Y2 goes low.

In response to the fall of the clock signal CLK1, further, an active enable signal OE (assumed to be at a high level here) is supplied to the data output buffer OB for activating the data output buffer OB, while an inactive enable signal IE (assumed to be at a low level here) is supplied to the data input buffer IB for inactivating the data input buffer IB.

The activated data output buffer OB outputs the data signals transferred to the input/output lines IO2 and /IO2 to the data input/output pin DQ.

Referring again to FIGS. 3 and 6, the control signals C2 and C3 are at low levels during this data transfer period, and hence the invertor IV1 supplies a low-level signal to the clock input CLK of the level keep circuit LK2. Consequently, the latch circuit formed by the NOR circuit NR31 and the invertor IV33 keeps the voltage Z2 (high level) of the signal transfer line DL2. On the other hand, the control signals C1 and C4 are at high levels and hence the level keep circuits LK1 and LK3 do not operate.

At a time t1, the clock signal CLK1 rises to a high level.

Thus, the transfer gates TG11 and TG14 of the flip-flop circuit FF1 shown in FIG. 4 are turned on from the off states, and the transfer gates TG12 and TG13 are turned off from the on states. The invertor IV13 inverts the voltage Z1 (high level) of the signal transfer line DL1 supplied to the input D of the flip-flop circuit FF1 and supplies the same to the node N12. Consequently, the node N12 goes low. Similarly, the node N12 of the flip-flop circuit FF3 goes high through the voltage Z3 (low level) of the signal transfer line DL3 supplied to the input D of the flip-flop circuit FF3. The transfer gates TG21 and TG24 of the flip-flop circuit FF2 shown in FIG. 5 are turned on from the off states, while the transfer gates TG22 and TG23 are turned off from the on states. The NAND circuit ND21 inverts the voltage Z2 (high level) of the signal transfer line DL2 supplied to the input D of the flip-flop circuit FF2 and supplies the same to the node N22. Thus, the node N22 goes low.

(2) Second Data Transfer Period (from time tc1 to time tc2)

At a time tc1, the clock signal CLK1 falls to a low level.

In response to this, data signals from any memory cell are read on the input/output lines IO1 and /IO1, similarly to the operation at the time tc0. It is assumed here that the voltage X1 is at a low level and the voltage X2 is at a high level.

In the flip-flop circuit FF1 shown in FIG. 4, the invertor IV15 inverts the low-level voltage of the node N12 and the output Q goes high. In the flip-flop circuit FF3, the invertor IV15 inverts the high-level voltage of the node N12 and the output Q goes low. In the flip-flop circuit FF2 shown in FIG. 5, the invertor IV25 inverts the high-level voltage of the node N22 and the output Q goes low.

Referring again to FIG. 3, the control signals C1 and C3 go high and the control signals C2 and C4 go low through the outputs Q from the flip-flop circuits FF1 to FF3.

In response to the control signals C1 to C4, the NMOS transistors QN1 and QN3 shown in FIG. 2 are turned on while the NMOS transistors QN2 and QN4 are turned off. Consequently, the N-channel MOS transistor QN1 of the selection circuit SLA connects the first end of the signal transfer line DL1 to the input/output line IO1 and the N-channel MOS transistor QN1 of the selection circuit SLB connects the second end of the signal transfer line DL1 to the input/output line IO2. Further, the N-channel MOS transistor QN3 of the selection circuit SLA connects the first end of the signal transfer line DL2 to the input/output line /IO1, and the N-channel MOS transistor QN3 of the selection circuit SLB connects the second end of the signal transfer line DL2 to the input/output line /IO2. The voltages Z1 and Z2 of the signal transfer lines DL1 and DL2 are at high levels. The signal transfer line DL3 is connected with none of the input/output lines IO1,/IO1, IO2 and /IO2.

Thus, the signal transfer lines DL1 and DL2 transfer the data signals on the input/output lines IO1 and /IO1 to the input/output lines IO2 and /IO2 respectively. Thus, the voltage Z1 of the signal transfer line DL1 goes low and the voltage Z2 of the signal transfer line DL2 goes high. Receiving the transferred data signals, the voltage Y1 goes low and the voltage Y2 goes high.

Further, the data signals transferred to the input/output lines IO2 and /IO2 are outputted to the data input/output pin DQ, similarly to the operation at the time tc0.

Referring again to FIGS. 3 and 6, the control signal C4 is at a low level during this data transfer period and hence the latch circuit formed by the NOR circuit NR31 and the invertor IV33 of the level keep circuit LK3 keeps the voltage Z3 (low level) of the signal transfer line DL3. On the other hand, the control signal C2 is at a low level and the control signal C3 is at a high level, and hence the invertor IV1 supplies a high-level signal to the clock input CLK of the level keep circuit LK2, so that the level keep circuit CLK2 does not operate. The level keep circuit LK1 does not operate either since the control signal C1 is at a high level.

At a time t2, the clock signal CLK1 rises to a high level.

Thus, the invertor IV13 inverts the voltage Z1 (low level) of the signal transfer line DL1 supplied to the input D of the flip-flop circuit FF1 and supplies the same to the node N12, similarly to the operation at the time t1. Consequently, the node N12 goes high. The node N12 of the flip-flop circuit FF3 goes high through the voltage Z3 (low level) of the signal transfer line DL3 supplied to the input D of the flip-flop circuit FF3. The node N22 of the flip-flop circuit FF2 goes low through the voltage Z2 (high level) of the signal transfer line DL2 supplied to the input D of the flip-flop circuit FF2.

(3) Third Data Transfer Period (from time tc2 to time tc3)

At a time tc2, the clock signal CLK1 falls to a low level.

In response to this, data signals from any memory cell are read on the input/output lines IO1 and /IO1, similarly to the operation at the time tc0. It is assumed here that the voltage X1 is at a low level and the voltage X2 is at a high level.

The outputs Q from the flip-flop circuits FF1 to FF3 go low, high and low respectively, similarly to the operation at the time tc1.

Referring again to FIG. 3, the control signals C1 and C4 go high and the control signals C2 and C3 go low through the outputs Q from the flip-flop circuits FF1 to FF3.

In response to the control signals C1 to C4, the NMOS transistors Qn1 and QN4 shown in FIG. 2 are turned on while the NMOS transistors QN2 and QN3 are turned off. Consequently, the first end of the signal transfer line DL1 is connected to the input/output line IO1 while the second end thereof is connected to the input/output line IO2. Further, the first end of the signal transfer line DL3 is connected to the input/output line /IO1 while the second end thereof is connected to the input/output line /IO2. The voltages Z1 and Z3 of the signal transfer lines DL1 and DL3 are at low levels. The signal transfer line DL2 is connected with none of the input/output lines IO1,/IO1, IO2 and /IO2.

Thus, the signal transfer lines DL1 and DL3 transfer the data signals on the input/output lines IO1 and /IO1 to the input/output lines IO2 and /IO2 respectively. Thus, the voltage Z1 of the signal transfer line DL1 goes low and the voltage Z3 of the signal transfer line DL3 goes high. Receiving the transferred data signals, the voltage Y1 goes low and the voltage Y2 goes high.

Further, the data signals transferred to the input/output lines IO2 and /IO2 are outputted to the data input pin DQ, similarly to the operation at the time tc0.

Referring again to FIGS. 3 and 6, the control signals C2 and C3 are at low levels during this data transfer period, and hence the invertor IV1 supplies a low-level signal to the clock input CLK of the level keep circuit LK2. Consequently, the latch circuit formed by the NOR circuit NR31 and the invertor IV33 keeps the voltage Z2 (high level) of the signal transfer line DL2. On the other hand, the control signals C1 and C4 are at high levels and hence the level keep circuits LK1 and LK3 do not operate.

At a time t3, the clock signal CLK1 rises to a high level.

Thus, the invertor IV13 inverts the voltage Z1 (low level) of the signal transfer line DL1 supplied to the input D of the flip-flop circuit FF1 and supplies the same to the node N12, similarly to the operation at the time t1. Consequently, the node N12 goes high. The node N12 of the flip-flop circuit FF3 goes low through the voltage Z3 (high level) of the signal transfer line DL3 supplied to the input D of the flip-flop circuit FF3. The node N22 of the flip-flop circuit FF2 goes low through the voltage Z2 (high level) of the signal transfer line DL2 supplied to the input D of the flip-flop circuit FF2.

(4) Fourth Data Transfer Period (from time tc3 to time tc4)

At a time tc3, the clock signal CLK1 falls to a low level.

In response to this, data signals from any memory cell are read on the input/output lines IO1 and /IO1, similarly to the operation at the time tc0. It is assumed here that the voltage X1 is at a low level and the voltage X2 is at a high level.

The outputs Q of the flip-flop circuits FF1 to FF3 go low, high and high respectively similarly to the operation at the time tc1.

Referring again to FIG. 3, the control signals C2 and C4 go high and the control signals C1 and C3 go low through the outputs Q from the flip-flop circuits FF1 to FF3.

In response to the control signals C1 to C4, the NMOS transistors QN2 and QN4 shown in FIG. 2 are turned on while the NMOS transistors QN1 and QN3 are turned off. Consequently, the first end of the signal transfer line DL2 is connected to the input/output line IO1 while the second end thereof is connected to the input/output line IO2. Further, the first end of the signal transfer line DL3 is connected to the input/output line /IO1 while the second end thereof is connected to the input/output line /IO2. The voltages Z2 and Z3 of the signal transfer lines DL2 and DL3 are at high levels. The signal transfer line DL1 is connected with none of the input/output lines IO1,/IO1, IO2 and /IO2.

Thus, the signal transfer lines DL2 and DL3 transfer the data signals on the input/output lines IO1 and /IO1 to the input/output lines IO2 and /IO2 respectively. Thus, the voltage Z2 of the signal transfer line DL2 goes low and the voltage Z3 of the signal transfer line DL3 goes high. Receiving the transferred data signals, the voltage Y1 goes low and the voltage Y2 goes high.

The data signals transferred to the input/output lines IO2 and /IO2 are outputted to the data input/output pin DQ, similarly to the operation at the time tc0.

Referring again to FIGS. 3 and 6, the control signal C1 is at a low level during this data transfer period, and hence the latch circuit formed by the NOR circuit NR31 and the invertor IV33 of the level keep circuit LK1 keeps the voltage Z1 (low level) of the signal transfer line DL1. On the other hand, the control signal C2 is at a high level and the control signal C3 is at a low level, and hence the invertor IV1 supplies a high-level signal to the clock input CLK of the level keep circuit LK2, so that the level keep circuit LK does not operate. The level keep circuit LK3 does not operate either since the control signal C4 is at a high level.

At a time t4, the clock signal CLK1 rises to a high level.

Thus, the invertor IV13 inverts the voltage Z1 (low level) of the signal transfer line DL1 supplied to the input D of the flip-flop circuit FF1 and supplies the same to the node N12, similarly to the operation at the time t1. Consequently, the node N12 goes high. The node N12 of the flip-flop circuit FF3 goes low through the voltage Z3 (high level) of the signal transfer line DL3 supplied to the input D of the flip-flop circuit FF3. The node N22 of the flip-flop circuit FF2 goes high through the voltage Z2 (low level) of the signal transfer line DL2 supplied to the input D of the flip-flop circuit FF2.

The DRAM transfers fifth and subsequent data similarly to the above.

While the above description has been made with reference to data signals read from the memory cell array MCA, an operation for writing external data signals in the memory cell array MCA is now described. The selection circuits SLA and SLB select two signal transfer lines for data transfer so that the selected signal transfer lines are connected to the input/output lines for transferring the data similarly to the above.

In response to fall of the clock signal CLK1, an active enable signal IE (assumed to be at a high level here) is supplied to the data input buffer IB for activating the data input buffer IB, while an inactive enable signal OE (assumed to be at a low level here) is supplied to the data output buffer OB for inactivating the data output buffer OB. The data input buffer IB supplies data signals from the data input/output pin DQ to the input/output lines IO2 and /IO2 as complementary signals. The two signal transfer lines selected by the selection circuits SLA and SLB transfer the signals to the input/output lines IO1 and /IO1, so that the data signals are written in a memory cell selected by the row decoder RD and the column decoder CD.

As hereinabove described, the data transfer circuit according to the embodiment 1 is also applicable to a circuit bidirectionally transferring data.

The voltages Z1 to Z3 of the signal transfer lines DL1 to DL3 in data transfer are now described with reference to FIG. 9.

In the reset period,, the signal transfer lines DL1 to DL3 are precharged at high levels. In the first data transfer, the signal transfer lines DL1 and DL3 are employed and the voltage Z1 of the signal transfer line DL1 goes high while the voltage Z3 of the signal transfer line DL3 goes low through the data transfer. On the other hand, the voltage Z2 of the signal transfer line DL2 is kept at the high level. In the second data transfer, the signal transfer line DL2 not employed for the first data transfer and the signal transfer line DL1 having the voltage Z1 equal to the voltage Z2 (high level) of the signal transfer line DL2 are employed. The signal transfer line DL3 is not employed for the second data transfer and the voltage Z3 thereof is kept at the low level. The voltage Z1 of the signal transfer line DL1 goes high and the voltage Z2 of the signal transfer line DL2 goes low through the second data transfer.

Thus, the DRAM selects and employs the signal transfer line not precedently employed and the signal transfer line having the voltage equal to that of the signal transfer line not precedently employed for each data transfer according to the embodiment 1. The two signal transfer lines employed for each data transfer may not be precharged since the voltages thereof are equal to each other. Consequently, the data transfer rate can be improved by a time required for precharging. Further, consumed power can be reduced by that required for precharging.

If the signal transfer lines DL1 to DL3 are increased in length, the data signals transferred through the signal transfer lines DL1 to DL3 may be attenuated or the waveforms thereof may be disturbed. In order to avoid this, buffers BFA and BFB and transfer gates TGA and TGB may be provided on intermediate portions of the signal transfer lines DL1 to DL3, as shown in FIG. 10. FIG. 10 shows only the signal transfer line DL1. The buffer BFA amplifies the signal inputted when the enable signal OE is active and shapes the waveform thereof. The transfer gate TGA is turned off when the enable signal OE is active, and turned on when the enable signal OE is inactive. The buffer BFB amplifies the signal inputted when the enable signal IE is active and shapes the waveform thereof The transfer gate TGB is turned off when the enable signal IE is active, and turned on when the enable signal IE is inactive. Thus, the data signal read from the memory cell array MCA is amplified and shaped by the buffer BFA and thereafter transferred to the selection circuit SLB through the transfer gate TGB. On the other hand, the data signal to be written in the memory cell array MCA is amplified and shaped by the buffer BFB and thereafter transferred to the selection circuit SLA through the transfer gate TGA. In case of only unidirectionally transferring data, a buffer BF shown in FIG. 11 can be provided.

[Embodiment 2]

Figure 12:
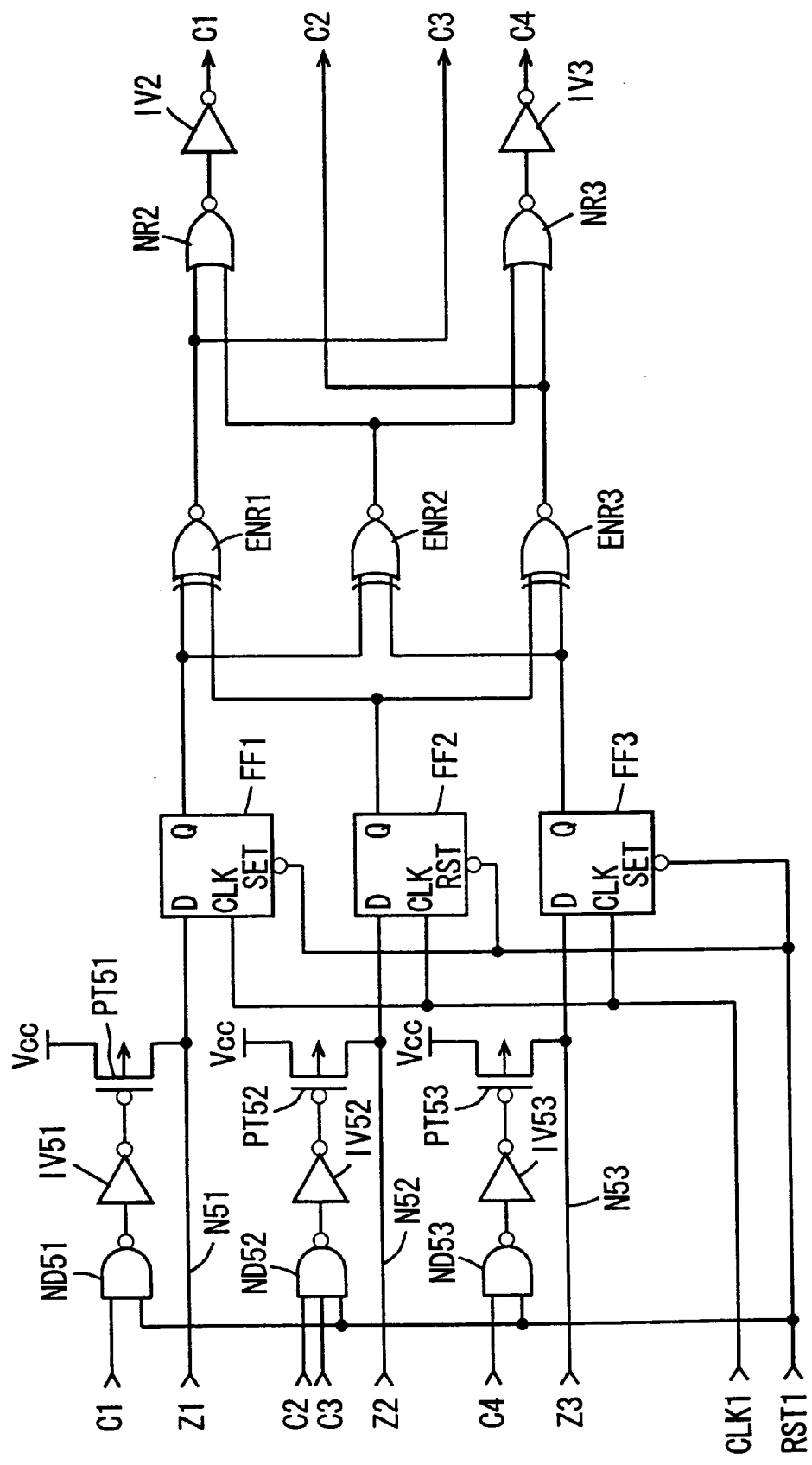
FIG. 12 is a block diagram showing the structure of a control circuit according to an embodiment 2 of the present invention.

As shown in FIG. 12, a data transfer circuit according to an embodiment 2 of the present invention includes NAND circuits ND51 to ND53, invertors IV51 to IV53 and P-channel MOS transistors PT51 to PT53, in place of the level keep circuits LK1 to LK3, the NOR circuit NR1 and the invertor IV1 shown in FIG. 3.

The NAND circuit ND51 outputs the NAND of a control signal C1 and a reset signal RST1. The NAND circuit ND52 outputs the NAND of control signals C2 and C3 and the reset signal RST1. The NAND circuit ND53 outputs the NAND of a control signal C4 and the reset signal RST1. The invertors IV51 to IV53 invert the outputs of the NAND circuits ND51 to ND53 respectively. The P-channel MOS transistor PT51 is connected between a power supply node VCC and a node N51 and receives an output of the invertor IV51 in its gate. The node N51 receives the voltage Z1 of a signal transfer line DL1. The P-channel MOS transistor PT52 is connected between a power supply node VCC and a node N52 and receives an output of the invertor IV52 in its gate. The node N52 receives the voltage Z2 of a signal transfer line DL2. The P-channel MOS transistor PT53 is connected between a power supply node VCC and a node N53 and receives an output of the invertor IV53 in its gate. The node N53 receives the voltage Z3 of a signal transfer line DL3.

Figures 13, 15:
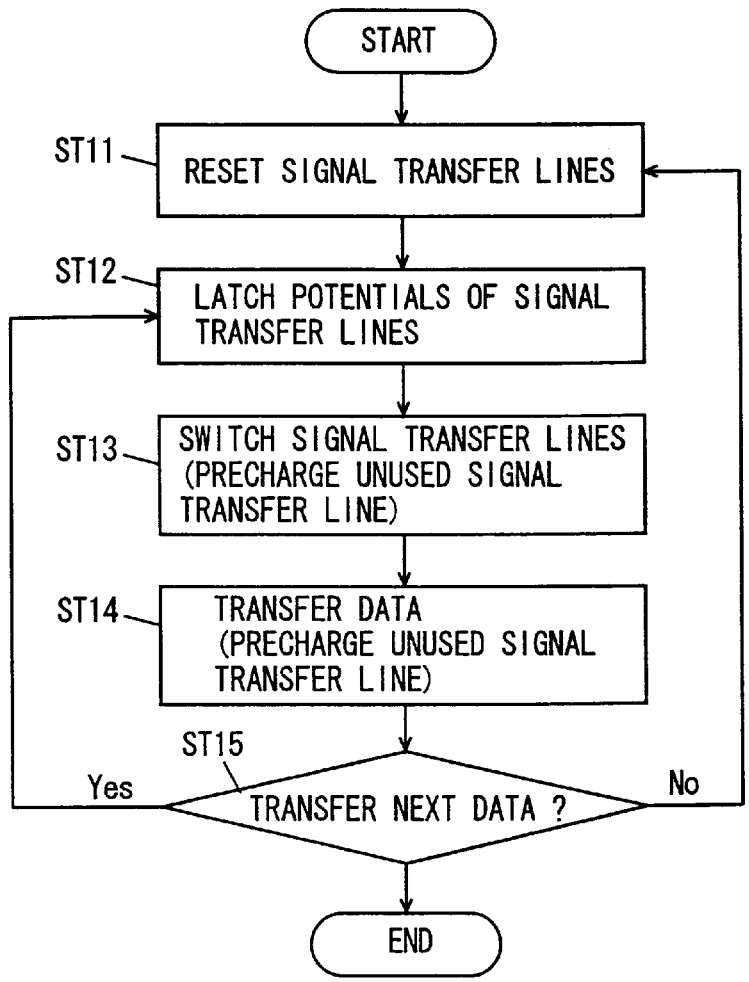
FIG. 13 is a flow chart for illustrating schematic operations of a DRAM according to the embodiment 2 of the present invention.
FIG. 15 illustrates voltages of signal transfer lines during a data transfer period.

Schematic operations of a DRAM to which the data transfer circuit having the aforementioned structure is applied are now described with reference to a flow chart shown in FIG. 13.

First, the DRAM precharges the signal transfer lines DL1 to DL3 at high levels at a step ST11.

Then, the DRAM latches the voltages Z1 to Z3 of the signal transfer lines DL1 to DL3 at a step ST12.

Then, the DRAM compares the voltages Z1 to Z3 of the signal transfer lines DL1 to DL3 latched at the step ST12 with each other at a step ST13 and selects two signal transfer lines (assumed to be the signal transfer lines DL1 and DL3 here) having equal voltages for connecting first ends thereof to input/output lines IO1 and /IO1 respectively while connecting second ends thereof to input/output lines IO2 and /IO2 respectively. The voltage Z2 of the remaining signal transfer line DL2 is precharged at a high level.

Then, the DRAM transfers data at a step ST14. During the data transfer, the voltage Z2 of the remaining signal transfer line DL2 is being precharged at the high level.

Then, the DRAM determines whether or not next data is to be transferred at a step ST15. The process returns to the step S12 if the determination is of yes. If the determination is of no, the process returns to the step ST11.

Operations of the DRAM according to the embodiment 2 for reading data signals from any memory cell of a memory cell array MCA similar to that shown in FIG. 1 are described with reference to FIG. 14.

(0) Reset Period (before time tc0)

Similarly to the operation in the embodiment 1, the DRAM precharges the voltages Z1 to Z3 of the signal transfer lines DL1 to DL3 at high levels. Outputs Q of flip-flop circuits FF1 and FF3 go high, and nodes N12 go low. An output Q of a flip-flop circuit FF2 goes low and a node N22 goes high.

(1) First Data Transfer Period (from time tc0 to time tc1)

At a time tc0, a clock signal CLK1 falls to a low level.

In response to this, data signals from any memory cell are read on the input/output lines IO1 and /IO1 as complementary data signals. It is assumed here that a voltage X1 is at a high level and a voltage X2 is at a low level.

In response to the fall of the clock signal CLK1, an N-channel MOS transistor QN1 of a selection circuit SLA connects a first end of the signal transfer line DL1 to the input/output line IO1 and an N-channel MOS transistor QN1 of a selection circuit SLB connects a second end of the signal transfer line DL1 to the input/output line IO2, similarly to the operation in the embodiment 1. Further, an N-channel MOS transistor QN4 of the selection circuit SLA connects a first end of the signal transfer line DL3 to the input/output line /IO1 and an N-channel MOS transistor QN4 of the selection circuit SLB connects a second end of the signal transfer line DL3 to the input/output line /IO2. The signal transfer line DL2 is connected with none of the input/output lines IO1,/IO1, IO2 and /IO2.

Thus, the signal transfer lines DL1 and DL3 transfer the data signals on the input/output lines IO1 and /IO1 to the input/output lines IO2 and /IO2 respectively. Thus, the voltage Z1 of the signal transfer line DL1 goes high and the voltage Z3 of the signal transfer line DL3 goes low. Receiving the transferred data signals, a voltage Y1 goes high and a voltage Y2 goes low.

Further, a data output buffer OB outputs the data signals transferred to the input/output lines IO2 and /IO2 to a data input/output pin DQ.

Referring again to FIG. 12, the control signals C1 and C4 are at high levels during this data transfer period, and hence the outputs of the invertors IV51 and IV53 go high. Thus, the P-channel MOS transistors PT51 and PT53 are turned off. On the other hand, the control signals C2 and C3 are at low levels and hence the output of the invertor IV52 goes low. Thus, the P-channel MOS transistor PT52 is turned on and the signal transfer line DL2 is precharged at a power supply voltage VCC (high level) through the node N52.

At a time t1, the clock signal CLK1 rises to a high level.

Thus, the node N12 of the flip-flop circuit FF1 goes low similarly to the embodiment 1. The node N12 of the flip-flop circuit FF3 goes high. The node N22 of the flip-flop circuit FF2 goes low.

(2) Second Data Transfer Period (from time tc1 to time tc2)

At a time tc1, the clock signal CLK1 falls to a low level.

In response to this, data signals from any memory cell are read on the input/output lines IO1 and /IO1. It is assumed here that the voltage X1 is at a low level and the voltage X2 is at a high level.

The output Q of the flip-flop circuit FF1 goes high. The output Q of the flip-flop circuit FF3 goes low. The output Q of the flip-flop circuit FF2 goes low.

The control signals C1 and C3 go high and the control signals C2 and C4 go low through the outputs Q from the flip-flop circuits FF1 to FF3.

In response to the control signals C1 to C4, NMOS transistors QN1 and QN3 similar to those shown in FIG. 2 are turned on while NMOS transistors QN2 and QN4 are turned off. Consequently, the first end of the signal transfer line DL1 is connected to the input/output line IO1, and the second end thereof is connected to the input/output line IO2. Further, the first end of the signal transfer line DL2 is connected to the input/output line /IO1, and the second end thereof is connected to the input/output line /IO2. The voltages Z1 and Z2 of the signal transfer lines DL1 and DL2 are at high levels. The signal transfer line DL3 is connected with none of the input/output lines IO1,/IO1, IO2 and /IO2.

Thus, the signal transfer lines DL1 and DL2 transfer the data signals on the input/output lines IO1 and /IO1 to the input/output lines IO2 and /IO2 respectively, and the voltage Z1 of the signal transfer line DL1 goes low while the voltage Z2 of the signal transfer line DL2 goes high. Receiving the transferred data signals, the voltage Y1 goes low and the voltage Y2 goes high.

Further, the data signals transferred to the input/output lines IO2 and /IO2 are outputted to the data input/output pin DQ.

Referring again to FIG. 12, the control signal C4 is at a low level during this data transfer period, and hence the output of the invertor IV53 goes low. Thus, the P-channel MOS transistor PT53 is turned on and the signal transfer line DL3 is precharged at a high level through the node N53. On the other hand, the control signal C2 is at a low level and the control signal C3 is at a high level, and hence the P-channel MOS transistor PT52 is turned off. The control signal C1 is at a high level, and hence the P-channel MOS transistor PT51 is turned off.

At a time t2, the clock signal CLK1 rises to a high level.

Thus, the invertor IV13 inverts the voltage Z1 (low level) of the signal transfer line DL1 supplied to the input D of the flip-flop circuit FF1, and the node N12 goes high. The node N12 of the flip-flop circuit FF3 goes low through the voltage Z3 (high level) of the signal transfer line DL3 supplied to the input D of the flip-flop circuit FF3. The node N22 of the flip-flop circuit FF2 goes low through the voltage Z2 (high level) of the signal transfer line DL2 supplied to the input D of the flip-flop circuit FF2.

(3) Third Data Transfer Period (from time tc2 to time tc3)

At a time tc2, the clock signal CLK1 falls to a low level.

In response to this, data signals from any memory cell are read on the input/output lines IO1 and /IO1. It is assumed here that the voltage X1 is at a low level and the voltage X2 is at a high level.

The outputs Q of the flip-flop circuits FF1 to FF3 go low, high and high respectively, similarly to the operation at the time tc1.

The control signals C2 and C4 go high and the control signals C1 and C3 go low through the outputs Q from the flip-flop circuits FF1 to FF3.

In response to the control signals C1 to C4, the NMOS transistors QN2 and QN4 similar to those shown in FIG. 2 are turned on and the NMOS transistors QN1 to QN3 are turned off. Consequently, the first end of the signal transfer line DL2 is connected to the input/output line IO1, and the second end thereof is connected to the input/output line IO2. The first end of the signal transfer line DL3 is connected to the input/output line /IO1, and the second end thereof is connected to the input/output line /IO2. The voltages Z2 and Z3 of the signal transfer lines DL2 and DL3 are at high levels. The signal transfer line DL1 is connected with none of the input/output lines IO1,/IO1, IO2 and /IO2.

Thus, the signal transfer lines DL2 and DL3 transfer the data signals on the input/output lines IO11 and /IO1 to the input/output lines IO2 and /IO2 respectively. The voltage Z2 of the signal transfer line DL2 goes low and the voltage Z3 of the signal transfer line DL3 goes high. Receiving the transferred data signals, the voltage Y1 goes low and the voltage Y2 goes high. Further, the data signals transferred to the input/output lines IO2 and /IO2 are outputted to the data input/output pin DQ, similarly to the operation at the time tc0.

Referring again to FIG. 12, the control signal C1 is at a low level during this data transfer period, and hence the output of the invertor IV51 goes low. Thus, the P-channel MOS transistor PT51 is turned on and the signal transfer line DL1 is precharged at a high level through the node N51. On the other hand, the control signal C2 is at a high level and the control signal C3 is at a low level, and hence the P-channel MOS transistor PT52 is turned off. The control signal C4 is at a high level, and hence the P-channel MOS transistor PT53 is turned off.

At a time t3, the clock signal CLK1 rises to a high level.

Thus, the invertor IV13 inverts the voltage Z1 (high level) of the signal transfer line DL1 supplied to the input D of the flip-flop circuit FF1 and the node N12 goes low, similarly to the operation at the time t1. The node N12 of the flip-flop circuit FF3 goes low through the voltage Z3 (high level) of the signal transfer line DL3 supplied to the input D of the flip-flop circuit FF3. The node N22 of the flip-flop circuit FF2 goes high through the voltage Z2 (low level) of the signal transfer line DL2 supplied to the input D of the flip-flop circuit FF2.

(4) Fourth Data Transfer Period (from time tc3 to time tc4)

At a time tc3, the clock signal CLK1 falls to a low level.

In response to this, data signals from any memory cell are read on the input/output lines IO1 and /IO1. It is assumed here that the voltage X1 is at a low level and the voltage X2 is at a high level.

The outputs Q of the flip-flop circuits FF1 to FF3 go high, low and high respectively, similarly to the operation at the time tc1.

The control signals C1 and C4 go high and the control signals C2 and C3 go low through the outputs Q from the flip-flop circuits FF1 to FF3.

In response to the control signals C1 to C4, the NMOS transistors QN1 and QN4 similar to those shown in FIG. 2 are turned on and the NMOS transistors QN2 and QN3 are turned off. Consequently, the first end of the signal transfer line DL1 is connected to the input/output line IO1, and the second end thereof is connected to the input/output line IO2. The first end of the signal transfer line DL3 is connected to the input/output line /IO1, and the second end thereof is connected to the input/output line /IO2. The voltages Z1 and Z3 of the signal transfer lines DL1 and DL3 are at high levels. The signal transfer line DL2 is connected with none of the input/output lines IO1,/IO1, IO2 and /IO2.

Thus, the signal transfer lines DL1 and DL3 transfer the data signals on the input/output lines IO1 and /IO1 to the input/output lines IO2 and /IO2 respectively. The voltage Z1 of the signal transfer line DL1 goes low and the voltage Z3 of the signal transfer line DL3 goes high. Receiving the transferred data signals, the voltage Y1 goes low and the voltage Y2 goes high. The data signals transferred to the input/output lines IO2 and /IO2 are outputted to the data input/output pin DQ.

Referring again to FIG. 12, the control signals C2 and C3 are at low levels during this data transfer period, and hence the output of the invertor IV52 goes low. Thus, the P-channel MOS transistor PT52 is turned on and the signal transfer line DL2 is precharged at a high level through the node N52. On the other hand, the control signals C1 and C4 are at high levels, and hence the P-channel MOS transistors PT51 and PT53 are turned off.

At a time t4, the clock signal CLK1 rises to a high level.

Thus, the invertor IV13 inverts the voltage Z1 (low level) of the signal transfer line DL1 supplied to the input D of the flip-flop circuit FF1, and the node N12 goes high. The node N12 of the flip-flop circuit FF3 goes low through the voltage Z3 (high level) of the signal transfer line DL3 supplied to the input D of the flip-flop circuit FF3. The node N22 of the flip-flop circuit FF2 goes low through the voltage Z2 (high level) of the signal transfer line DL2 supplied to the input D of the flip-flop circuit FF2.

The DRAM transfers fifth and subsequent data similarly to the above.

While the above description has been made with reference to data signals read from the memory cell array MCA, an operation for writing external data signals in the memory cell array MCA is now described. The selection circuits SLA and SLB select two signal transfer lines for data transfer so that the selected signal transfer lines are connected to the input/output lines for transferring the data similarly to the above.

In response to fall of the clock signal CLK1, an active enable signal IE (assumed to be at a high level here) is supplied to the data input buffer IB for activating the data input buffer IB, while an inactive enable signal OE (assumed to be at a low level here) is supplied to the data output buffer OB for inactivating the data output buffer OB. The data input buffer IB supplies data signals from the data input/output pin DQ to the input/output lines IO2 and /IO2 as complementary signals. Two signal transfer lines selected by the selection circuits SLA and SLB transfer the signals to the input/output lines IO1 and /IO1, so that the data signals are written in a memory cell selected by a row decoder RD and a column decoder CD.

As hereinabove described, the data transfer circuit according to the embodiment 2 is also applicable to a circuit bidirectionally transferring data.

The voltages Z1 to Z3 of the signal transfer lines DL1 to DL3 in data transfer are now described with reference to FIG. 15.

In the reset period,, the signal transfer lines Dl1 to DL3 are precharged at high levels. In the first data transfer, the signal transfer lines DL1 and DL3 are employed and the voltage Z1 of the signal transfer line DL1 goes high while the voltage Z3 of the signal transfer line DL3 goes low through the data transfer. On the other hand, the voltage Z2 of the signal transfer line DL2 is precharged at a high level. In the second data transfer, the signal transfer line DL2 not employed for the first data transfer and the signal transfer line DL1 having the voltage Z1 equal to the voltage Z2 (high level) of the signal transfer line DL2 are employed. The signal transfer line DL3 is not employed for the second data transfer and the voltage Z3 thereof is precharged from the low level to a high level. The voltage Z1 of the signal transfer line DL1 goes low and the voltage Z2 of the signal transfer line DL2 goes high through the second data transfer. In the third data transfer, the signal transfer line DL3 not employed for the second data transfer and the signal transfer line DL2 having the voltage Z1 equal to the voltage Z3 (high level) of the signal transfer line DL3 are employed. The signal transfer line DL1 is not employed for the third data transfer, and the voltage Z1 thereof is precharged from the low level to a high level. The voltage Z2 of the signal transfer line DL2 goes low and the voltage Z3 of the signal transfer line DL3 goes high through the third data transfer.

Thus, the DRAM precharges the voltage of the unused signal transfer line to a high level during each data transfer period according to the embodiment 2, whereby no precharge period may be separately provided between the data transfer periods. Consequently, the data transfer rate can be improved. Further, the data transfer circuit can be implemented with only a differential amplifier for a high level. In addition, the two signal transfer lines employed for data transfer are at high levels before the data transfer, and hence an amplifier circuit on the receiving end for the transferred data can be simplified.

The data transfer circuit can be provided with the buffers BFA and BFB and the transfer gates TGA and TGB shown in FIG. 10, similarly to the embodiment 1. Further, the buffer BF shown in FIG. 11 can be provided in case of only unidirectionally transferring data.

[Embodiment 3]

Figure 16:
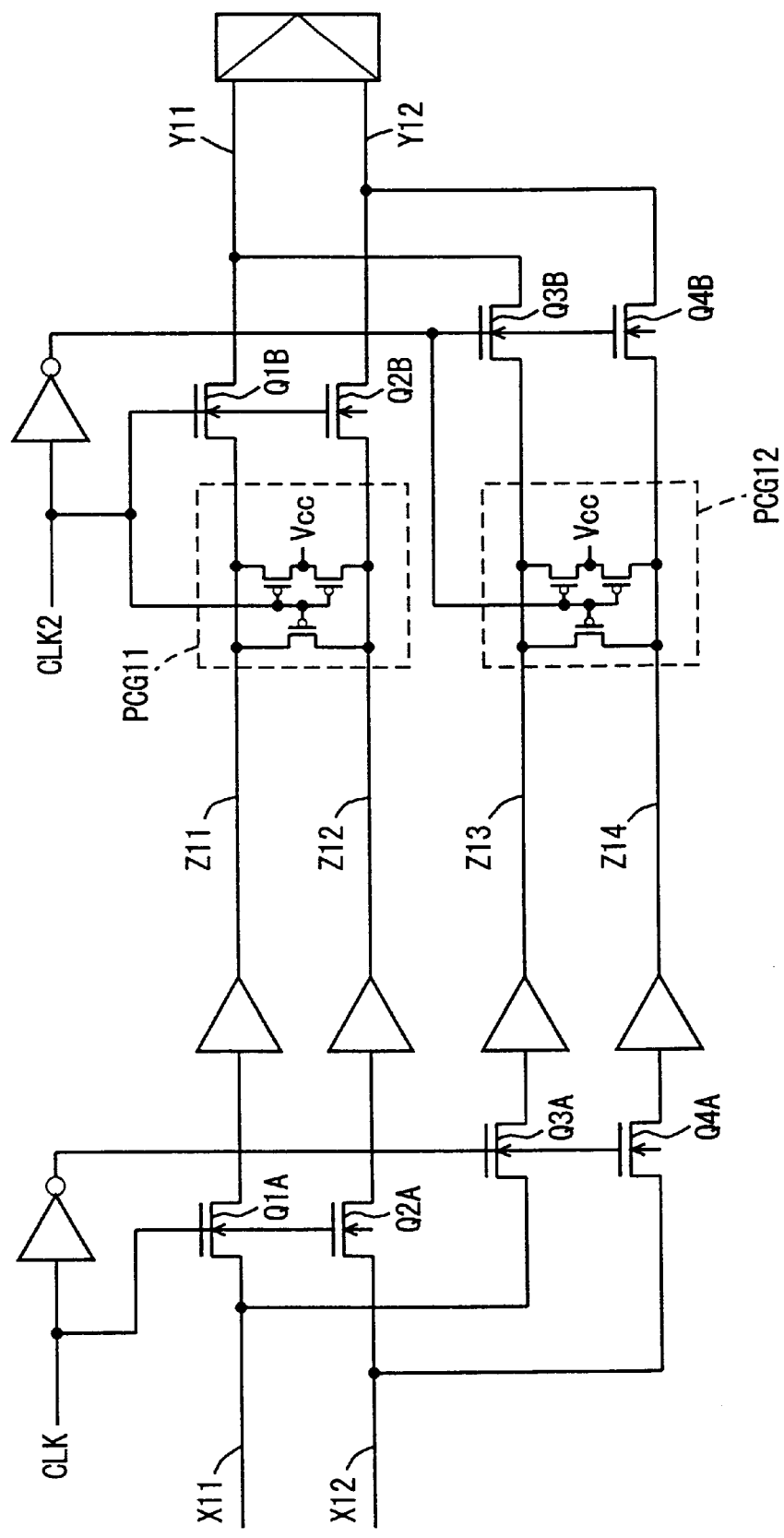
FIG. 16 is a block diagram showing the structure of a conventional interleave circuit.

FIG. 16 shows a conventional interleave circuit for improving a data transfer rate. An interleave circuit according to an embodiment 3 of the present invention is obtained by improving the interleave circuit shown in FIG. 16.

When clock signals CLK and CLK2 go high, the interleave circuit shown in FIG. 16 connects signal transfer lines Z11 and Z12 to data lines X11 and X12 and data lines Y11 and Y12, for transferring data from the data lines X11 and X12 to the data lines Y11 and Y12. A precharge circuit PCG12 precharges signal transfer lines Z13 and Z14 at high levels during this period.

When the clock signals CLK and CLK2 go low, the interleave circuit connects the signal transfer lines Z13 and Z14 to the data lines X11 and X12 and the data lines Y11 and Y12, for transferring data from the data lines X11 and X12 to the data lines Y11 and Y12. The precharge circuit PCG11 precharges the signal transfer lines Z11 and Z12 at high levels during this period.

Figure 17:
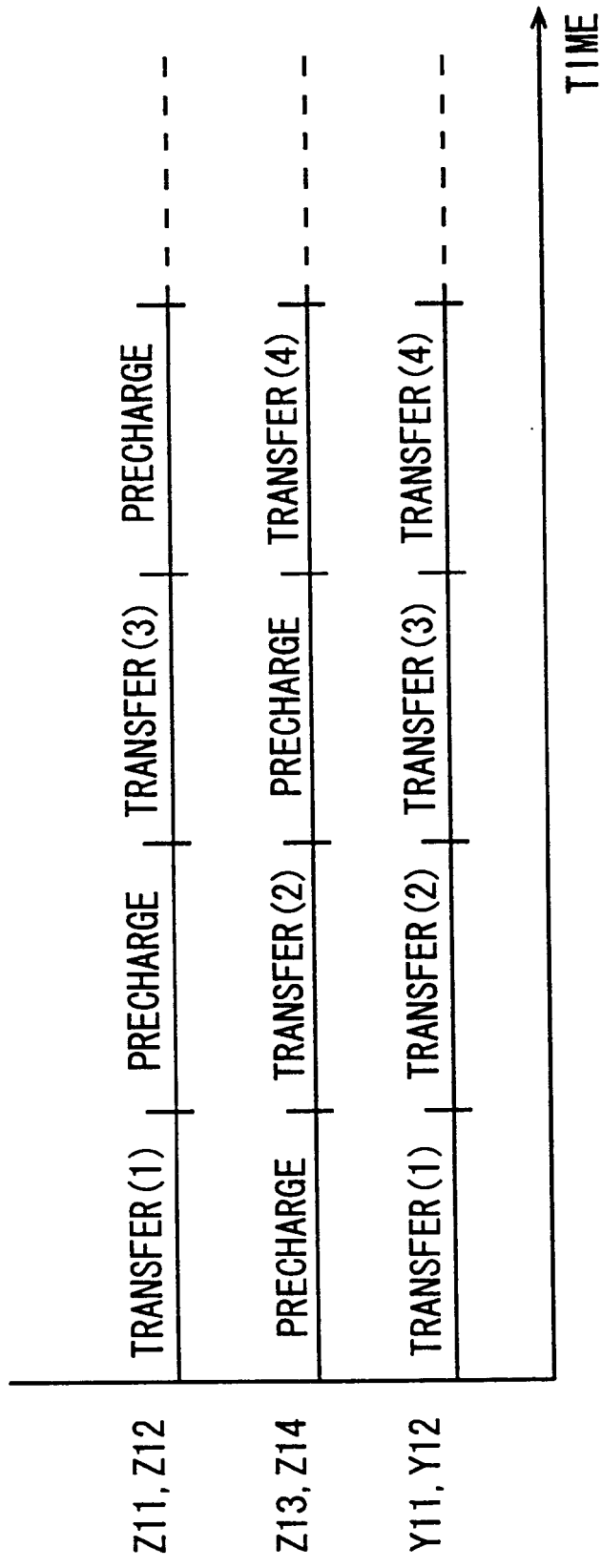
FIG. 17 illustrates operations of the interleave circuit shown in FIG. 16.

Thus, the interleave circuit alternately repeats data transfer and precharging for regularly transferring data to the data lines Y11 and Y12 as shown in FIG. 17, thereby improving the data transfer rate. However, the interleave circuit requiring four signal transfer lines cannot be implemented with higher degree of integration. The interleave circuit according to the embodiment 3 of the present invention has been proposed in order to solve this problem.

Figure 18:
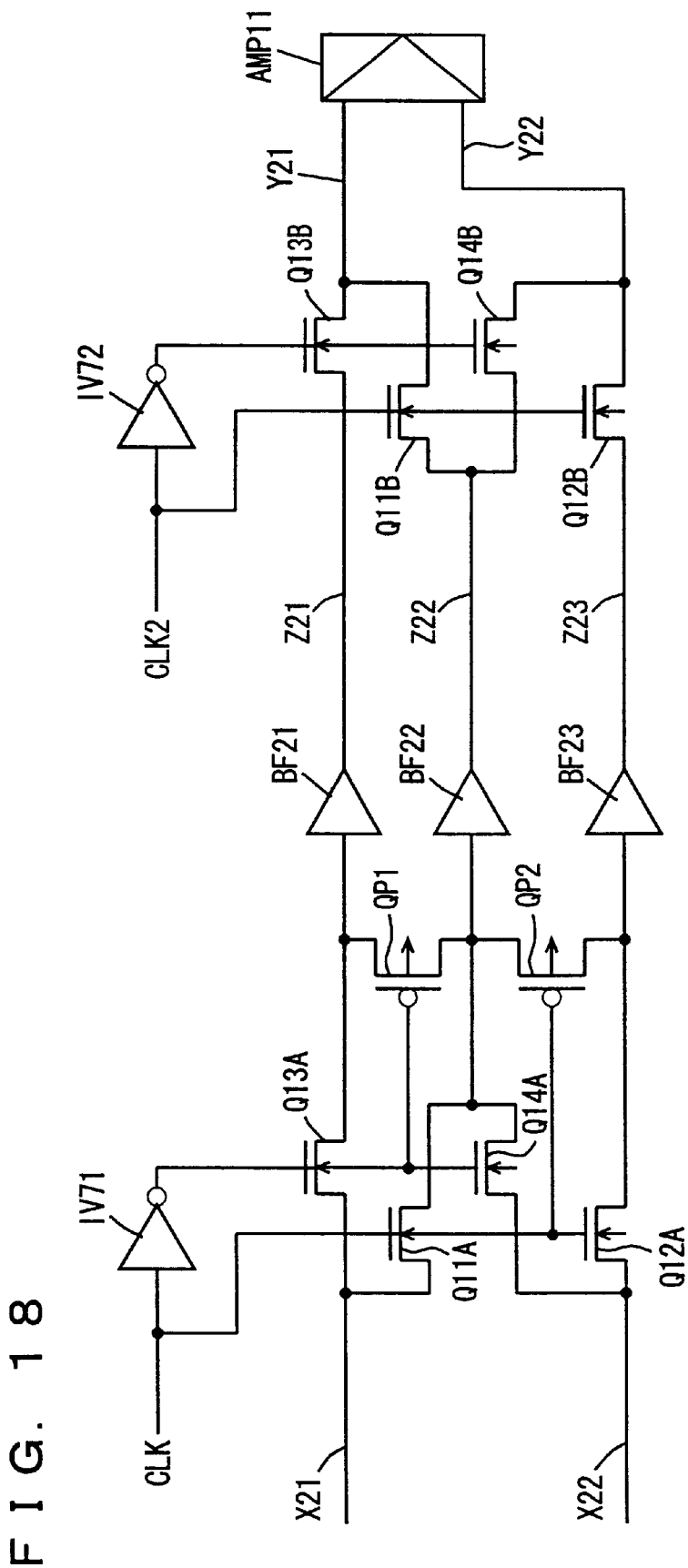
FIG. 18 is a block diagram showing the structure of an interleave circuit according to an embodiment 3 of the present invention.

FIG. 18 is a block diagram showing the structure of the interleave circuit according to the embodiment 3 of the present invention. Referring to FIG. 18, the interleave circuit includes invertors IV71 and IV72, N-channel MOS transistors Q11A to Q14A and Q11B to Q14B, P-channel MOS transistors QP1 and QP2, buffers BF21 to BF23, signal transfer lines Z21 to Z23, data lines X21, X22, Y21 and Y22, and a differential amplifier AMP11.

The invertors IV71 and IV72 invert clock signals CLK and CLK2 respectively. The N-channel MOS transistor Q11A is connected between the data line X21 and the signal transfer line Z22 and turned on/off in response to the clock signal CLK. The N-channel MOS transistor Q12A is connected between the data line X22 and the signal transfer line Z23 and turned on/off in response to the clock signal CLK. The N-channel MOS transistor Q13A is connected between the data line X21 and the signal transfer line Z21 and turned on/off in response to an inverted signal /CLK of the clock signal CLK. The N-channel MOS transistor Q14A is connected between the data line X22 and the signal transfer line Z22 and turned on/off in response to the inverted signal /CLK of the clock signal CLK.

The N-channel MOS transistor Q11B is connected between the data line Y21 and the signal transfer line Z22 and turned on/off in response to the clock signal CLK2. The N-channel MOS transistor Q12B is connected between the data line Y22 and the signal transfer line Z23 and turned on/off in response to the clock signal CLK2. The N-channel MOS transistor Q13B is connected between the data line Y21 and the signal transfer line Z21 and turned on/off in response to an inverted signal /CLK2 of the clock signal CLK2. The N-channel MOS transistor Q14B is connected between the data line Y22 and the signal transfer line Z22 and turned on/off in response to the inverted signal /CLK2 of the clock signal CLK2.

The P-channel MOS transistor QP1 is connected between the signal transfer lines Z21 and Z22 and turned on/off in response to the inverted signal /CLK of the clock signal CLK. The P-channel MOS transistor QP2 is connected between the signal transfer lines Z22 and Z23 and turned on/off in response to the clock signal CLK. The buffers BF21 to BF23 are provided on intermediate portions of the signal transfer lines Z21 to Z23 respectively, for amplifying and shaping data signals transferred on the signal transfer lines Z21 to Z23. The data lines X21 and X22 and the data lines Y21 and Y22 form pairs respectively for transferring complementary data. The differential amplifier AMP11 amplifies the potential difference between the data lines Y21 and Y22.

Figure 19:
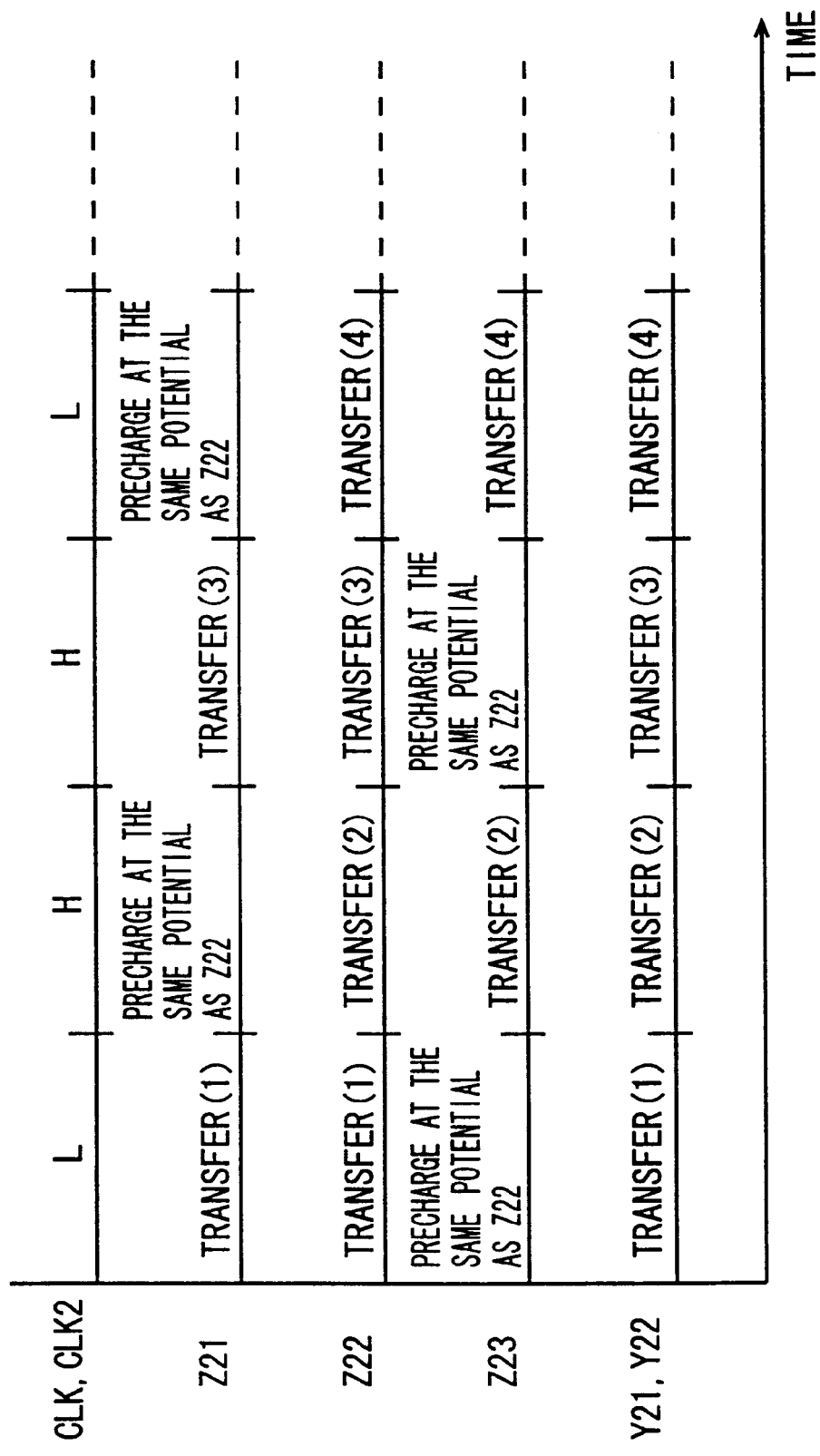
FIG. 19 illustrates operations of the interleave circuit shown in FIG. 18.

Operations of the interleave circuit having the aforementioned circuit are now described with reference to FIG. 19.

The interleave circuit sets the clock signals CLK and CLK2 low for transferring first data. Thus, the N-channel MOS transistors Q13A, Q14A, Q13B and Q14B are turned on, the N-channel MOS transistors Q11A, Q12A, Q11B and Q12B are turned off, the signal transfer line Z21 is connected to the data lines X21 and Y21, and the signal transfer line Z22 is connected to the data lines X22 and Y22. Consequently, complementary data signals on the data lines X21 and X22 are transferred to the data lines Y21 and Y22 through the signal transfer lines Z21 and Z22. At this time, the P-channel MOS transistor QP2 is turned on. Thus, the potential of the signal transfer line Z23 is equalized with that of the signal transfer line Z22.

Then, the interleave circuit sets the clock signals CLK and CLK2 high for transferring second data. Thus, the N-channel MOS transistors Q11A, Q12A, Q11B and Q12B are turned on, the N-channel MOS transistors Q13A, Q14A, Q13B and Q14B are turned off, the signal transfer line Z22 is connected to the data lines X21 and Y21, and the signal transfer line Z23 is connected to the data lines X22 and Y22. Consequently, complementary data signals on the data lines X21 and X22 are transferred to the data lines Y21 and Y22 through the signal transfer lines Z22 and Z23. The potential of the signal transfer line Z22 has been equalized with that of the signal transfer line Z23 in the first data transfer and hence the signal transfer line Z22 may not be precharged.

At this time, the P-channel MOS transistor QP1 is turned on. Thus, the potential of the signal transfer line Z21 is equalized with that of the signal transfer line Z22.

The interleave circuit transfers subsequent data similarly to the above.

As hereinabove described, the interleave circuit according to the embodiment 3 alternately selects the signal transfer lines Z21 and Z23 for employing the same for data transfer with the signal transfer line Z22, while precharging the non-selected signal transfer line Z23 or Z21 at the same potential as the signal transfer line Z22. The interleave circuit regularly employs the signal transfer line Z22 for data transfer. Thus, no precharge cycle is required for transferring data to the data lines Y21 and Y22. Consequently, the interleave circuit obtains the same data transfer rate as the interleave circuit shown in FIG. 16, reduces the numbers of the signal transfer lines and the transistors, and is integrated.

The interleave circuit, unidirectionally transferring data signals in the above description, is also applicable to a circuit such as the DRAM shown in FIG. 11 having the input/output lines bidirectionally transferring data signals. In this case, the buffers BFA and BFB shown in FIG. 10 can be employed in place of the buffers BF21 to BF23.

[Embodiment 4]

In the interleave circuit shown in FIG. 16, the two signal transfer lines for transferring data are previously precharged at high levels, and hence either signal transfer line changes from a high level to a low level in data transfer. On the other hand, the non-connected signal transfer line is precharged at a high level. Any one of the precharged signal transfer lines is precharged from a low level to a high level. Thus, the interleave circuit performs operations in the signal transfer lines for transferring data and the signal transfer lines to be precharged, and hence consumes double power as compared with a data transfer circuit shown in FIG. 26 transferring data through two signal transfer lines. An embodiment 4 of the present invention has been proposed in order to solve this problem.

Figure 20:
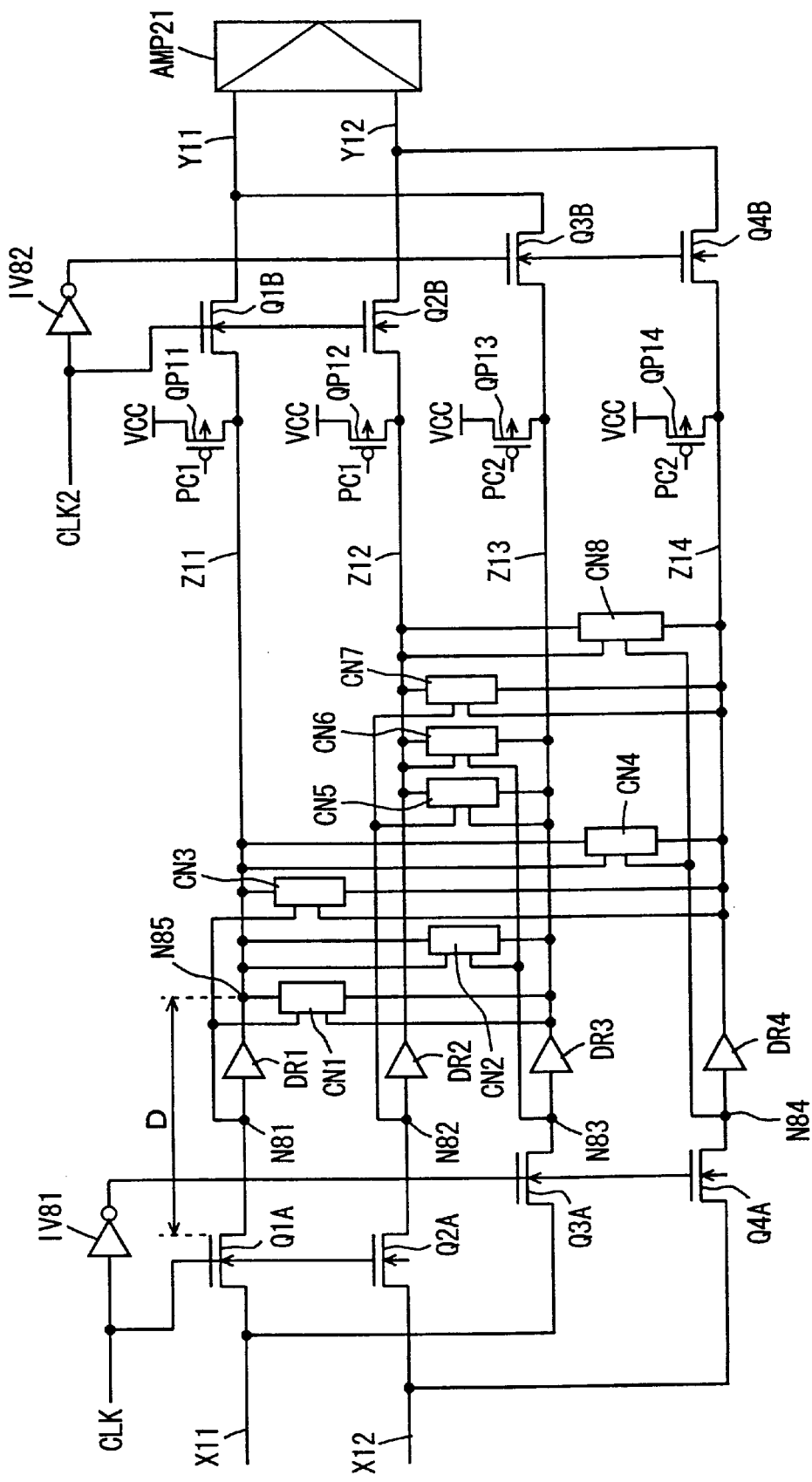
FIG. 20 is a block diagram showing the structure of an interleave circuit according to an embodiment 4 of the present invention.

FIG. 20 is a block diagram showing the structure of an interleave circuit according to the embodiment 4 of the present invention. Referring to FIG. 20, the interleave circuit includes invertors IV81 and IV82, N-channel MOS transistors Q1A to Q4A and Q1B to Q4B, P-channel MOS transistors QP11 to QP14, buffers DR1 to DR4, signal transfer lines Z11 to Z14, data lines X11, X12, Y11 and Y12, a differential amplifier AMP 21 and connection circuits CN1 to CN8.

The invertors IN81 and IV82 invert clock signals CLK and CLK2 respectively. The N-channel MOS transistor Q1A is connected between the data line X11 and the signal transfer line Z11 and turned on/off in response to the clock signal CLK. The N-channel MOS transistor Q2A is connected between the data line X12 and the signal transfer line Z12 and turned on/off in response to the clock signal CLK. The N-channel MOS transistor Q3A is connected between the data line X11 and the signal transfer line Z13 and turned on/off in response to an inverted signal /CLK of the clock signal CLK. The N-channel MOS transistor Q4A is connected between the data line X12 and the signal transfer line Z14 and turned on/off in response to the inverted signal /CLK of the clock signal CLK. The N-channel MOS transistor Q1B is connected between the data line Y11 and the signal transfer line Z11 and turned on/off in response to the clock signal CLK2. The N-channel MOS transistor Q2B is connected between the data line Y12 and the signal transfer line Z12 and turned on/off in response to the clock signal CLK2. The N-channel MOS transistor Q3B is connected between the data line Y11 and the signal transfer line Z13 and turned on/off in response to an inverted signal /CLK2 of the clock signal CLK2. The N-channel MOS transistor Q4B is connected between the data line Y12 and the signal transfer line Z14 and turned on/off in response to the inverted signal /CLK2 of the clock signal CLK2. The P-channel MOS transistor QP11 is connected between a power supply node Vcc and the signal transfer line Z11 and turned on/off in response to a precharge signal PC1. The P-channel MOS transistor QP12 is connected between a power supply node Vcc and the signal transfer line Z12 and turned on/off in response to the precharge signal PC1. The P-channel MOS transistor QP13 is connected between a power supply node Vcc and the signal transfer line Z13 and turned on/off in response to a precharge signal PC2. The P-channel MOS transistor QP14 is connected between a power supply node Vcc and the signal transfer line Z14 and turned on/off in response to the precharge signal PC2. The buffers DR1 to DR4 are provided on intermediate portions of the signal transfer lines Z11 to Z14, for amplifying and shaping data signals transferred on the signal transfer lines Z11 to Z14. The data lines X11 and X12 and the data lines Y11 and Y12 form pairs respectively, for transferring complementary data. The differential amplifier AMP21 amplifies the potential difference between the data lines Y11 and Y12.

The connection circuit CN1 is provided between the signal transfer lines Z11 and Z13, for connecting/disconnecting the signal transfer lines Z11 and Z13 with/from each other in response to the voltage of a node N81 and that of the signal transfer line Z13. The connection circuit CN2 is provided between the signal transfer lines Z11 and Z13, for connecting/disconnecting the signal transfer lines Z11 and Z13 with/from each other in response to the voltage of a node N83 and that of the signal transfer line Z11. The connection circuit CN3 is provided between the signal transfer lines Z11 and Z14, for connecting/disconnecting the signal transfer lines Z11 and Z14 with/from each other in response to the voltage of the node N81 and that of the signal transfer line Z14. The connection circuit CN4 is provided between the signal transfer lines Z11 and Z14, for connecting/disconnecting the signal transfer lines Z11 and Z14 with/from each other in response to the voltage of a node N84 and that of the signal transfer line Z11. The connection circuit CN5 is connected between the signal transfer lines Z12 and Z13, for connecting/disconnecting the signal transfer lines Z12 and Z13 with/from each other in response to the voltage of a node N82 and that of the signal transfer line Z13. The connection circuit CN6 is provided between the signal transfer lines Z12 and Z13, for connecting/disconnecting the signal transfer lines Z12 and Z13 with/from each other in response to the voltage of the node N83 and that of the signal transfer line Z12. The connection circuit CN7 is provided between the signal transfer lines Z12 and Z14, for connecting/disconnecting the signal transfer lines Z12 and Z14 with/from each other in response to the voltage of the node N82 and that of the signal transfer line Z14. The connection circuit CN8 is provided between the signal transfer lines Z12 and Z14, for connecting/disconnecting the signal transfer lines Z12 and Z14 with/from each other in response to the voltage of the node N84 and that of the signal transfer line Z12.

Figure 21:
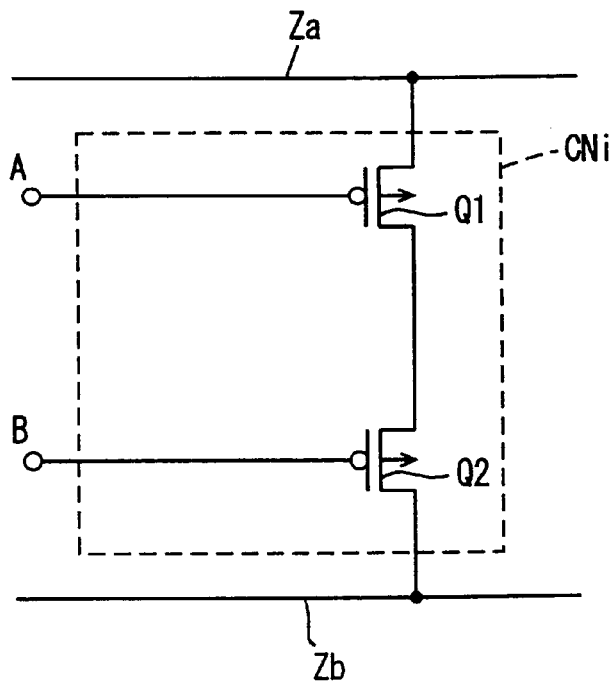
FIG. 21 is a circuit diagram showing the structure of a connection circuit shown in FIG. 20.

FIG. 21 is a circuit diagram showing the structure of any connection circuit CNi (i=1 to 8) shown in FIG. 20. Referring to FIG. 21, the connection circuit CNi includes P-channel MOS transistors Q1 and Q2. The P-channel MOS transistor Q1 is connected between a signal transfer line Za and the P-channel MOS transistor Q2, and its gate is connected to an input node A. The P-channel MOS transistor Q2 is connected between the P-channel MOS transistor Q1 and a signal transfer line Zb, and its gate is connected to an input node B.

In the connection circuit CN1, the signal transfer lines Za and Zb are the signal transfer lines Z11 and Z13 respectively, the input node A is connected to the node N81, and the input node B is connected to the signal transfer line Z13. In the connection circuit CN2, the signal transfer lines Za and Zb are the signal transfer lines Z13 and Z11 respectively, the input node A is connected to the node N83, and the input node B is connected to the signal transfer line Z11. In the connection circuit CN3, the signal transfer lines Za and Zb are the signal transfer lines Z11 and Z14 respectively, the input node A is connected to the node N81, and the input node B is connected to the signal transfer line Z14. In the connection circuit CN4, the signal transfer lines Za and Zb are the signal transfer lines Z14 and Z11 respectively, the input node A is connected to the node N84, and the input node B is connected to the signal transfer line Z11. In the connection circuit CN5, the signal transfer lines Za and Zb are the signal transfer lines Z12 and Z13 respectively, the input node A is connected to the node N82, and the input node B is connected to the signal transfer line Z13. In the connection circuit CN6, the signal transfer lines Za and Zb are the signal transfer lines Z13 and Z12 respectively, the input node A is connected to the node N83, and the input node B is connected to the signal transfer line Z12. In the connection circuit CN7, the signal transfer lines Za and Zb are the signal transfer lines Z12 and Z14 respectively, the input node A is connected to the node N82, and the input node B is connected to the signal transfer line Z14. In the connection circuit CN8, the signal transfer lines Za and Zb are the signal transfer lines Z14 and Z12 respectively, the input node A is connected to the node N84, and the input node B is connected to the signal transfer line Z12.

Figure 22:
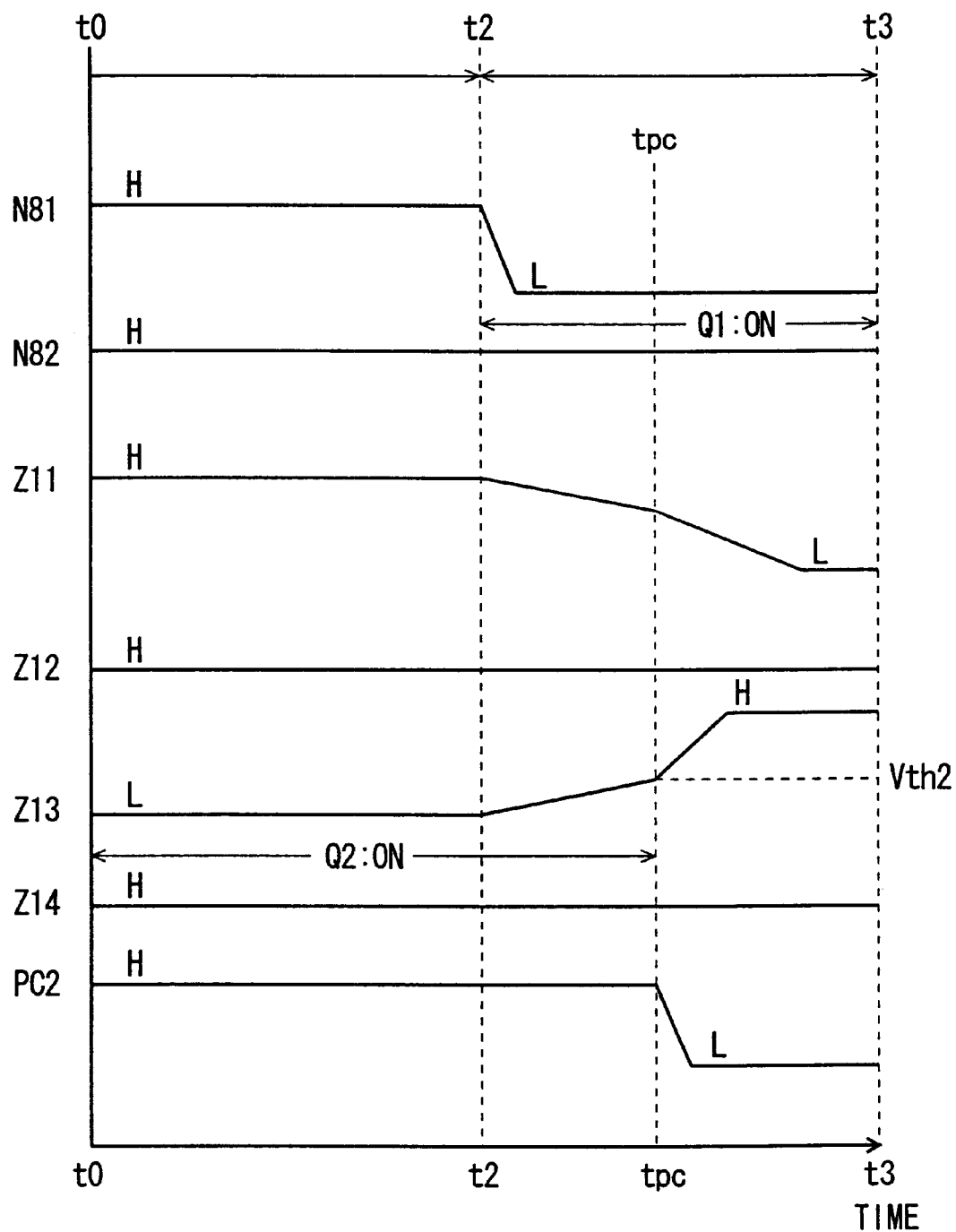
FIG. 22 is a timing chart for illustrating operations of the interleave circuit shown in FIG. 20.

Operations of the interleave circuit having the aforementioned structure are now described with reference to FIG. 22.

(1) First Data Transfer (transferred data signals: X11=L, X12=H)

The interleave circuit transfers data through the signal transfer lines Z13 and Z14 between times t0 and t2. At this time, the clock signals CLK and CLK2 are at low levels, the N-channel MOS transistors Q3A, Q4A, Q3B and Q4B are turned on, the N-channel MOS transistors Q1A, Q2A, Q1B and Q2B are turned off, the signal transfer line Z13 is connected to the data lines X11 and Y11, and the signal transfer line Z14 is connected to the data lines X12 and Y12. The signal transfer line Z13 transfers a low-level data signal, and the signal transfer line Z14 transfers a high-level data signal. Consequently, a low-level data signal on the data line X1 and a high-level data signal on the data line X12 are transferred to the data lines Y11 and Y12 through the signal transfer lines Z13 and Z14 respectively. On the other hand, the signal transfer lines Z11 and Z12 are precharged at high levels. Therefore, the nodes N81 and N82 go high. Consequently, the P-channel MOS transistor Q1 in the connection circuit CN1 is turned off while the P-channel MOS transistor Q2 is turned on.

(2) Second Data Transfer (transferred data signals: X11=L, X12=H)

Then, the clock signals CLK and CLK2 go high at the time t2. Thus, the N-channel MOS transistors Q1A, Q2A, Q1B and Q2B are turned on, the N-channel MOS transistors Q3A, Q4A, Q3B and Q4B are turned off, the signal transfer line Z11 is connected to the data lines X11 and Y11, and the signal transfer line Z12 is connected to the data lines X12 and Y12.

When the node N81 receiving a low-level data signal on the data line X11 goes low, the P-channel MOS transistor Q1 of the connection circuit CN1 is turned on. Thus, the signal transfer lines Z11 and Z13 are connected with each other and charges of the signal transfer line Z11 precharged at a high level move to the low-level signal transfer line Z13 through the P-channel MOS transistors Q1 and Q2. Consequently, the signal transfer line Z13 is charged and the signal transfer line Z11 is discharged.

At a time tpc, the voltage of the signal transfer line Z13 reaches the threshold value Vth2 of the P-channel MOS transistor Q2 and the P-channel MOS transistor Q2 is turned off. The signal transfer line Z11 is disconnected from the signal transfer line Z13. The precharge signal PC2 goes low, and the P-channel MOS transistor QP13 is turned on. Thus, the signal transfer line Z13 is completely precharged to a high level.

Thus, the interleave circuit employs remaining charges of the signal transfer line Z11 for precharging the signal transfer line Z13 at a high speed, and the power consumed for precharging can be reduced. Further, the rate for data transfer on the signal transfer line Z11 is improved.

In order to attain the aforementioned effects, the node N81 must be located between the node N85 and the N-channel MOS transistor Q1A (D in FIG. 20). This is because the charges of the signal transfer line Z11 cannot be supplied to the signal transfer line Z13 unless the P-channel MOS transistor Q1A is turned on before the voltage of the node N85 receiving the data signal from the data line X11 changes from a high level to a low level. The position of the node N81 is preferably closer to the N-channel MOS transistor Q1A.

While the interleave circuit transfers the first (precedent) data signals (X11=L, X12=H) through the signal transfer lines Z13 and Z14 and transfers the second (present) data signals (X11=L, X12=H) through the signal transfer lines Z11 and Z12 in the above description, effects similar to the above can be attained through the connection circuit CN2 to CN8 in the following cases:

When transferring first (precedent) data signals (X11=L, X12=H) through the signal transfer lines Z11 and Z12 while transferring second (present) data signals (X11=L, X12=H) through the signal transfer lines Z13 and Z14, the connection circuit CN2 attains effects similar to the above.

When transferring first (precedent) data signals (X11=H, X12=L) through the signal transfer lines Z13 and Z14 while transferring second (present) data signals (X11=L, X12=H) through the signal transfer lines Z11 and Z12, the connection circuit CN3 attains effects similar to the above.

When transferring first precedent) data signals (X11=L, X12=H) through the signal transfer lines Z1 and Z12 while transferring second (present) data signals (X11=H, X12=L) through the signal transfer lines Z13 and Z14, the connection circuit CN4 attains effects similar to the above.

When transferring first (precedent) data signals (X11=L, X12=H) through the signal transfer lines Z13 and Z14 while transferring second (present) data signals (X11=H, X12=L) through the signal transfer lines Z11 and Z12, the connection circuit CN5 attains effects similar to the above.

When transferring first (precedent) data signals (X11=H, X12=L) through the signal transfer lines Z11 and Z12 while transferring second (present) data signals (X11=L, X12=H) through the signal transfer lines Z13 and Z14, the connection circuit CN6 attains effects similar to the above.

When transferring first (precedent) data signals (X11=H, X12=L) through the signal transfer lines Z13 and Z14 while transferring second (present) data signals (X11=H, X12=L) through the signal transfer lines Z11 and Z12, the connection circuit CN7 attains effects similar to the above.

When transferring first (precedent) data signals (X11=H, X12=L) through the signal transfer lines Z11 and Z12 while transferring second (present) data signals (X11=H, X12=L) through the signal transfer lines Z13 and Z14, the connection circuit CN8 attains effects similar to the above.

[Modification 1 of Embodiment 4]

Figure 23:
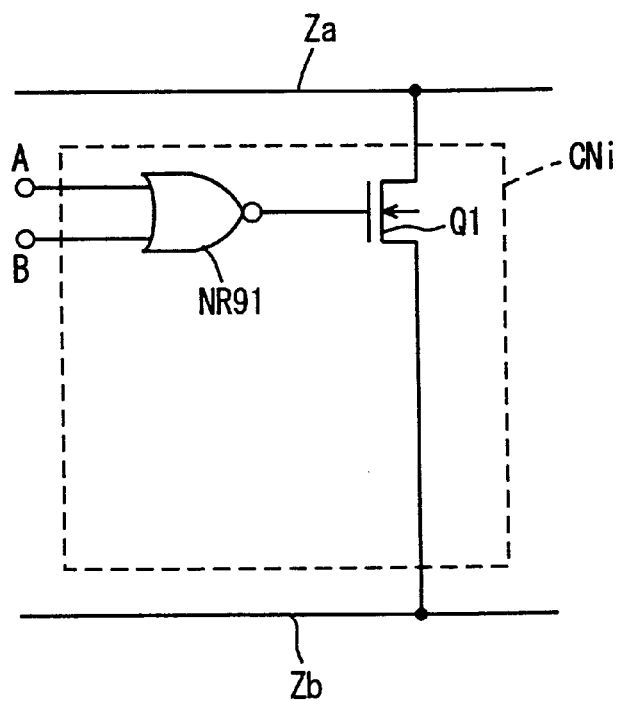
FIGS. 23 and 24 are block diagrams showing other structures of the connection circuit shown in FIG. 20.

An interleave circuit according to a modification 1 of the embodiment 4 of the present invention is identical in structure to that shown in FIG. 20, except that the same includes a connection circuit CNi (i=1 to 8) shown in FIG. 23 in place of the connection circuit CNi shown in FIG. 21.

Referring to FIG. 23, the connection circuit CNi includes an N-channel MOS transistor Q1 and a NOR circuit NR91. The N-channel MOS transistor Q1 is connected between signal transfer lines Za and Zb, and receives an output from the NOR circuit NR91 in its gate. The NOR circuit NR91 outputs the NOR of the voltages of input nodes A and B. As to each of connection circuits CN1 to CN8, the signal transfer lines Za and Zb and the input nodes A and B are connected to elements similar to those in the embodiment 4.

Operations of the interleave circuit having the aforementioned structure are now described.

In the following description, the signal transfer line Zb transfers a low-level data signal and the signal transfer line Za is precharged at a high level in first data transfer, while the signal transfer line Za transfers a low-level data signal and the signal transfer line Zb transfers no data in second data transfer.

When the input node A goes low, both inputs A and B go low and hence the output of the NOR circuit NR91 goes high. Thus, the N-channel MOS transistor Q1 is turned on. Thus, the signal transfer lines Za and Zb are connected with each other, and charges of the signal transfer line Za precharged at the high level move to the low-level signal transfer line Zb. Consequently, the signal transfer line Zb is charged and the signal transfer line Za is discharged. Thereafter the voltage of the signal transfer line Zb exceeds the threshold value of the NOR circuit NR91, and the output from the NOR circuit NR91 goes low while the N-channel MOS transistor Q1 is turned off. The signal transfer lines Za and Zb are disconnected from each other. As hereinabove described, the connection circuit CNi shown in FIG. 23 operates similarly to the connection circuit CNi shown in FIG. 21. Therefore, the interleave circuit employing the connection circuit CNi shown in FIG. 23 attains effects similar to those in the embodiment 4.

[Modification 2 of Embodiment 4]

Figure 24:
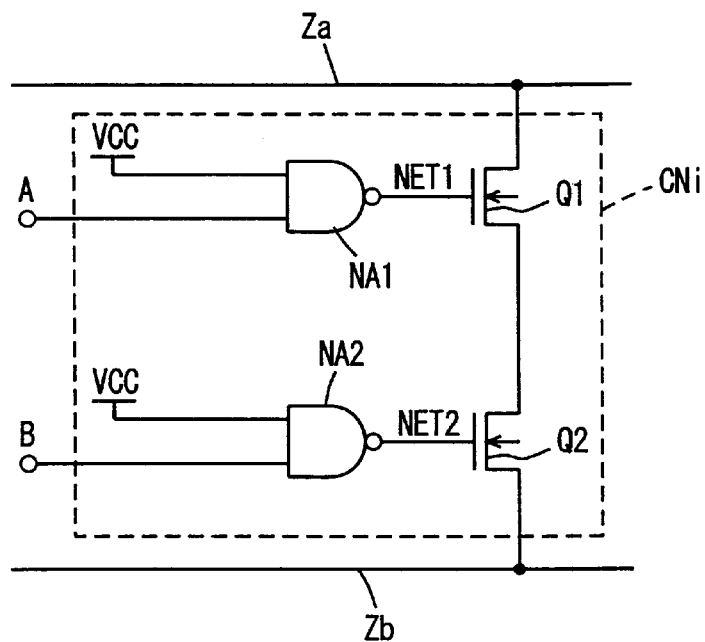
Figure 27:
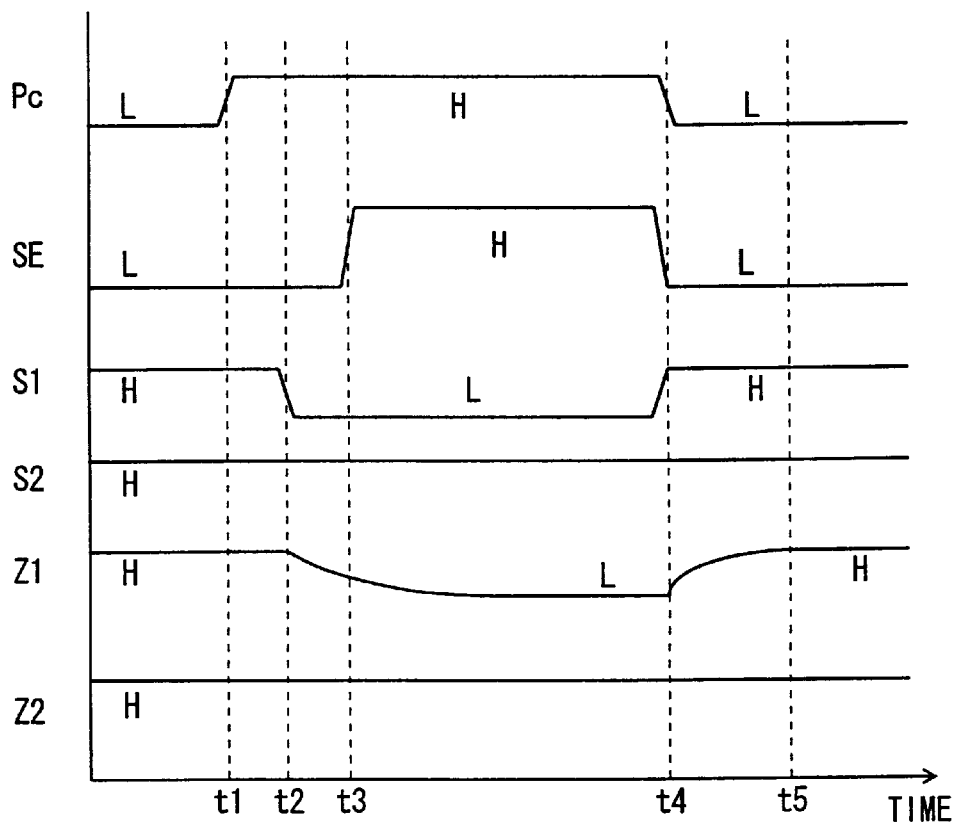
FIG. 27 is a timing chart for illustrating operations of the data transfer circuit shown in FIG. 26.

An interleave circuit according to a modification 2 of the embodiment 4 is identical in structure to that shown in FIG. 20 except that the same includes a connection circuit CNi (i=1 to 8) shown in FIG. 24 in place of the connection circuit CNi shown in FIG. 21.

Referring to FIG. 24, the connection circuit CNi includes N-channel MOS transistors Q1 and Q2 and NAND circuits NA1 and NA2. The N-channel MOS transistors Q1 and Q2 are serially connected between signal transfer lines Za and Zb. Outputs NET1 and NET2 from the NAND circuits NA1 and NA2 are supplied to gates of the N-channel MOS transistors Q1 and Q2 respectively. The NAND circuit NA1 outputs the NAND of the voltage of an input node A and a power supply voltage Vcc. The NAND circuit NA2 outputs the NAND of the voltage of an input node B and the power supply voltage Vcc. As to each of connection circuits CN1 to CN8, the signal transfer lines Za and Zb and the input nodes A and B are connected with elements similar to those shown in the embodiment 4.

Operations of the interleave circuit having the aforementioned structure are now described.

In the following description, the signal transfer line Zb transfers a low-level data signal and the signal transfer line Za is precharged at a high level in first data transfer, while the signal transfer line Za transfers a low-level data signal and the signal transfer line Zb transfers no data in second data transfer.

In the first data transfer, the input node A is at a high level and hence the output NET1 of the NAND circuit NA1 goes low while the N-channel MOS transistor Q1 is turned off. The input node B is at a low level and hence the output NET2 of the NAND circuit NA2 goes high while the N-channel MOS transistor Q2 is turned off.

When the interleave circuit starts the second data transfer and the input node A goes low, the output NET1 of the NAND circuit NA1 goes high. The N-channel MOS transistor Q1 is turned on in response. Thus, the signal transfer lines Za and Zb are connected with each other, and charges of the signal transfer line Za precharged at the high level move to the low-level signal transfer line Zb. Consequently, the signal transfer line Zb is charged and the signal transfer line Za is discharged. When the voltage of the signal transfer line Zb thereafter exceeds the threshold value of the NAND circuit NA2, the output NET2 from the NAND circuit NA2 goes low and the N-channel MOS transistor Q2 is turned off. The signal transfer lines Za and Zb are disconnected from each other. As hereinabove described, the connection circuit CNi shown in FIG. 24 operates similarly to the connection circuit CNi shown in FIG. 21. Thus, the interleave circuit employing the connection circuit CNi shown in FIG. 24 attains effects similar to those in the embodiment 4.

[Embodiment 5]

Figure 25:
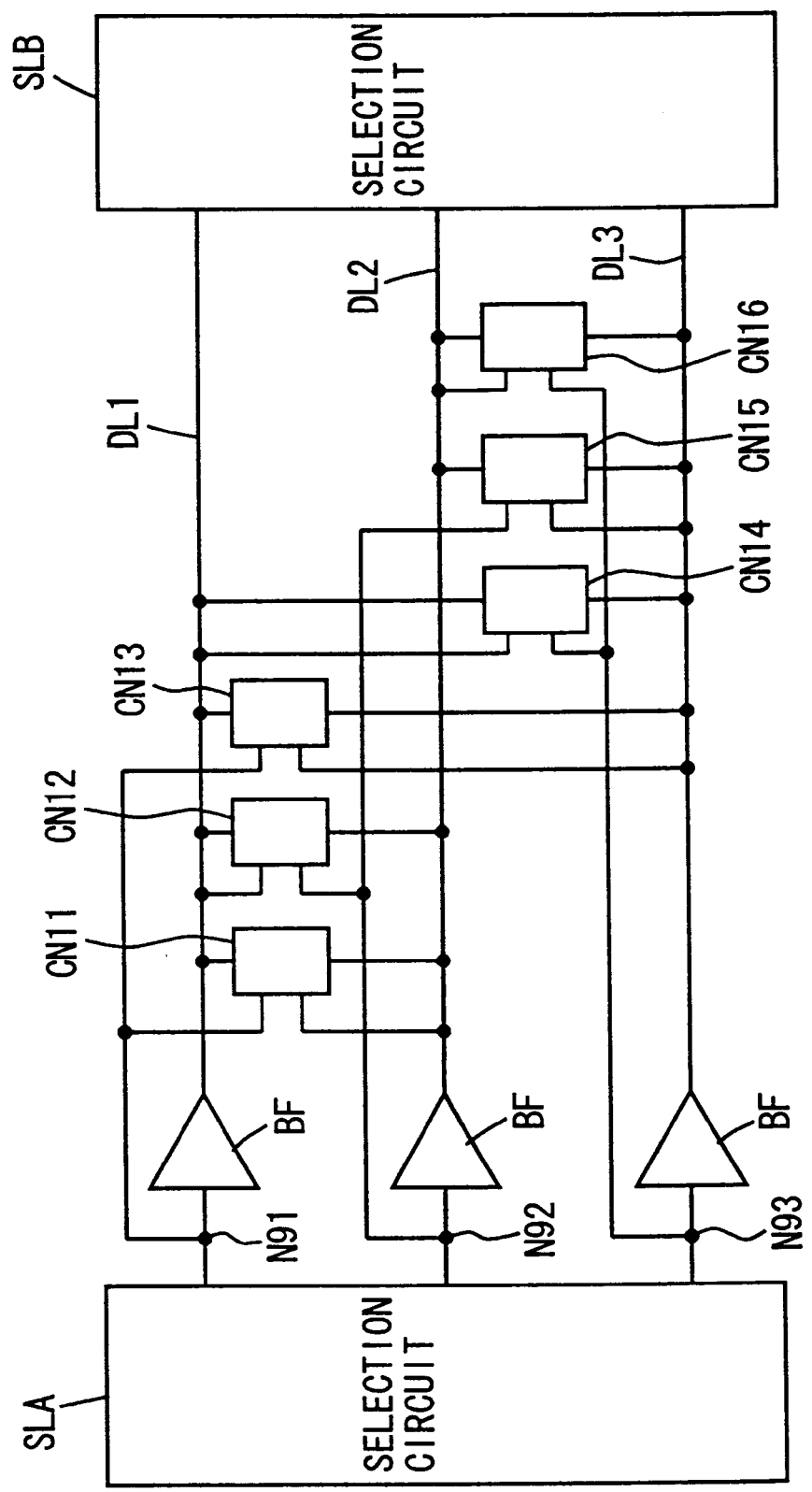
FIG. 25 is a block diagram showing the structure of a data transfer circuit according to an embodiment 5 of the present invention.

FIG. 25 is a block diagram showing the structure of a data transfer circuit according to an embodiment 5 of the present invention. Referring to FIG. 25, the data transfer circuit includes connection circuits CNi (i=11 to 16) each having a structure similar to that shown in FIG. 21, in addition to the structure of the data transfer circuit according to the embodiment 2.

In the connection circuit CN11, signal transfer lines Za and Zb are signal transfer lines DL1 and DL2 respectively, an input node A is connected to a node N91, and an input node B is connected to the signal transfer line DL2. In the connection circuit CN12, signal transfer lines Za and Zb are the signal transfer lines DL2 and DL1 respectively, an input node A is connected to a node N92, and an input node B is connected to the signal transfer line DL1. In the connection circuit CN13, signal transfer lines Za and Zb are the signal transfer line DL1 and a signal transfer line DL3 respectively, an input node A is connected to the node N91, and an input node B is connected to the signal transfer line DL3. In the connection circuit CN14, signal transfer lines Za and Zb are the signal transfer lines DL3 and DL1 respectively, an input node A is connected to a node N93, and an input node B is connected to the signal transfer line DL1. In the connection circuit CN15, signal transfer lines Za and Zb are the signal transfer lines DL2 and DL3 respectively, an input node A is connected to the node N92, and an input node B is connected to the signal transfer line DL3. In the connection circuit CN16, signal transfer lines Za and Zb are the signal transfer lines DL3 and DL2 respectively, an input node A is connected to the node N93, and an input node B is connected to the signal transfer line DL2.

Operations of the data transfer circuit having the aforementioned structure are now described.

First, the data transfer circuit precharges the signal transfer lines DL1 to DL3 at high levels.

Then, the data transfer circuit selects two signal transfer lines (assumed to be the signal transfer lines DL2 and DL3 here) for connecting first ends thereof to input/output lines IO1 and /IO1 respectively and connecting second ends thereof to input/output lines IO2 and /IO2 respectively. The remaining signal transfer line DL1 is precharged at a high level.

Then, the data transfer circuit transfers first data. The data transfer line DL2 transfers a low-level data signal, and the data transfer line DL3 transfers a high-level data signal. Therefore, the P-channel MOS transistor Q1 of the connection circuit CN1 is turned off while the P-channel MOS transistor Q2 is turned on.

Then, the data transfer circuit transfers second data. At this time, the data transfer circuit selects the data transfer line DL1 not employed for the first data transfer and the data transfer line DL3 having a voltage equal to that of the data transfer line DL1. In the second data transfer, the data transfer line DL1 transfers a low-level data signal, and the data transfer line DL3 transfers a high-level data signal.

When the node N91 receives the low-level data signal through a selection circuit SLA, the P-channel MOS transistor Q1 of the connection circuit CN1 is turned on. Thus, the signal transfer lines DL1 and DL2 are connected with each other, and charges of the signal transfer line DL1 precharged at a high level move to the low-level signal transfer line DL2 through the P-channel MOS transistors Q1 and Q2. Consequently, the signal transfer line DL2 is charged and the signal transfer line DL1 is discharged.

When the voltage of the signal transfer line DL2 exceeds the threshold value Vth2 of the P-channel MOS transistor Q2, the P-channel MOS transistor Q2 is turned off. At this time, the signal transfer lines DL1 and DL2 are disconnected from each other. Further, a P-channel MOS transistor PT52 completely precharges the signal transfer line DL2 to a high level, as shown in the embodiment 2.

Thus, the data transfer circuit employs remaining charges of the signal transfer line DL1 for precharging the signal transfer line DL2 at a high speed, and the power consumed for precharging can be reduced. Further, the rate for data transfer on the signal transfer line DL1 is increased.

While the data transfer circuit transfers first (precedent) data signals (X1=L, X2=H) through the signal transfer lines DL2 and DL3 and transfers second (present) data signals (X1=L, X2=H) through the signal transfer lines DL1 and DL3 in the above description, effects similar to the above can be attained through the connection circuit CN12 to CN16 in the following cases:

When transferring first (precedent) data signals (X1=L, X2=H) through the signal transfer lines DL1 and DL3 while transferring second (present) data signals (X1=L, X2=H) through the signal transfer lines DL2 and DL3, the connection circuit CN12 attains effects similar to the above.

When transferring first (precedent) data signals (X1=H, X2=L) through the signal transfer lines DL2 and DL3 while transferring second (present) data signals (X1=L, X2=H) through the signal transfer lines DL1 and DL2, the connection circuit CN13 attains effects similar to the above.

When transferring first (precedent) data signals (X1=L, X2=H) through the signal transfer lines DL1 and DL2 while transferring second (present) data signals (X1=H, X2=L) through the signal transfer lines DL2 and DL3, the connection circuit CN14 attains effects similar to the above.

When transferring first (precedent) data signals (X1=H, X2=L) through the signal transfer lines DL1 and DL3 while transferring second (present) data signals (X1=H, X2=L) through the signal transfer lines DFL1 and DL2, the connection circuit CN15 attains effects similar to the above.

When transferring first (precedent) data signals (X1=H, X2=L) through the signal transfer lines DL1 and DL2 while transferring second (present) data signals (X1=H, X2=L) through the signal transfer lines DL1 and DL3, the connection circuit CN16 attains effects similar to the above.

While the connection circuit CNi is similar in structure to that shown in FIG. 21, a structure similar to that shown in FIG. 23 or 24 is also employable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data transfer circuit comprising:
    first and second nodes receiving mutually complementary data signals;
    third and fourth nodes transmitting said mutually complementary data signals;
    first to third signal transfer lines; and
    a selection circuit disposed to select a signal transfer line having the same potential as that of a precedently non-selected signal transfer line from two precedently selected signal transfer lines and said precedently non-selected signal transfer line among said first to third signal transfer lines and connect first ends thereof to said first and second nodes respectively while connecting second ends thereof to said third and fourth nodes respectively.

2. The data transfer circuit according to claim 1, wherein said third and fourth nodes further receive mutually complementary data signals, and
    said first and second nodes further transmit said mutually complementary data signals.

3. The data transfer circuit according to claim 1, wherein said selection circuit includes a keep circuit disposed to keep the potential of a non-selected one of said first to third signal transfer lines.

4. The data transfer circuit according to claim 2, wherein said selection circuit includes a keep circuit disposed to keep the potential of a non-selected one of said first to third signal transfer lines.

5. The data transfer circuit according to claim 1, wherein said selection circuit includes a precharge circuit disposed to precharge a non-selected one of said first to third signal transfer lines at a logical high level.

6. The data transfer circuit according to claim 2, wherein said selection circuit includes a precharge circuit disposed to precharge a non-selected one of said first to third signal transfer lines at a logical high level.

7. The data transfer circuit according to claim 1, wherein said selection circuit includes:
- a control circuit disposed to generate first to fourth control signals in response to a clock signal,
- a first transistor connected between said first node and said first signal transfer line and turned on/off in response to said first control signal,
- a second transistor connected between said first node and said second signal transfer line and turned on/off in response to said second control signal,
- a third transistor connected between said second node and said second signal transfer line and turned on/off in response to said third control signal,
- a fourth transistor connected between said second node and said third signal transfer line and turned on/off in response to said fourth control signal,
- a fifth transistor connected between said third node and said first signal transfer line and turned on/off in response to said first control signal,
- a sixth transistor connected between said third node and said second signal transfer line and turned on/off in response to said second control signal,
- a seventh transistor connected between said fourth node and said second signal transfer line and turned on/off in response to said third control signal, and
- an eighth transistor connected between said fourth node and said third signal transfer line and turned on/off in response to said fourth control signal.

8. A data transfer circuit comprising:
- first and second nodes receiving mutually complementary data signals;
- third and fourth nodes transmitting said mutually complementary data signals;
- first to third signal transfer lines;
- a selection circuit disposed to select said second signal transfer line and a precedently non-selected one of said first and third signal transfer lines a precedently non-selected and connect first ends thereof to said first and second nodes respectively while connecting second ends thereof to said third and fourth nodes respectively; and
- a precharge circuit disposed to precharge a non-selected one of said first and third signal selection lines at the same potential as that of said second signal transfer line.

9. The data transfer circuit according to claim 8, wherein said third and fourth nodes further receive mutually complementary data signals, and
said first and second nodes further transmit said mutually complementary data signals.

10. The data transfer circuit according to claim 8, wherein said selection circuit includes:
- a first transistor connected between said first signal transfer line and said first node,
- a second transistor connected between said second signal transfer line and said second node and turned on/off simultaneously with said first transistor,
- a third transistor connected between said second signal transfer line and said first node and turned on/off complementarily with said first and second transistors,
- a fourth transistor connected between said third signal transfer line and said second node and turned on/off complementarily with said first and second transistors,
- a fifth transistor connected between said first signal transfer line and said third node,
- a sixth transistor connected between said second signal transfer line and said fourth node and turned on/off simultaneously with said fifth transistor,
- a seventh transistor connected between said second signal transfer line and said third node and turned on/off complementarily with said fifth and sixth transistors, and
- an eighth transistor connected between said third signal transfer line and said fourth node and turned on/off complementarily with said fifth and sixth transistors.

11. The data transfer circuit according to claim 9, wherein said selection circuit includes:
- a first transistor connected between said first signal transfer line and said first node,
- a second transistor connected between said second signal transfer line and said second node and turned on/off simultaneously with said first transistor,
- a third transistor connected between said second signal transfer line and said first node and turned on/off complementarily with said first and second transistors,
- a fourth transistor connected between said third signal transfer line and said second node and turned on/off complementarily with said first and second transistors,
- a fifth transistor connected between said first signal transfer line and said third node,
- a sixth transistor connected between said second signal transfer line and said fourth node and turned on/off simultaneously with said fifth transistor,
- a seventh transistor connected between said second signal transfer line and said third node and turned on/off complementarily with said fifth and sixth transistors, and
- an eighth transistor connected between said third signal transfer line and said fourth node and turned on/off complementarily with said fifth and sixth transistors.

12. The data transfer circuit according to claim 10, wherein said precharge circuit includes:
- a ninth transistor connected between said first signal transfer line and said second signal transfer line and turned on/off complementarily with said first and second transistors, and
- a tenth transistor connected between said second signal transfer line and said third signal transfer line and turned on/off complementarily with said third and fourth transistors.

13. A data transfer circuit comprising:
- first and second nodes receiving mutually complementary data signals;
- third and fourth nodes transmitting said mutually complementary data signals;
- first to fourth signal transfer lines;
- a first selection circuit disposed to alternately select said first and second signal transfer lines and said third and fourth signal transfer lines in response to a clock signal and connect first ends of said selected two signal transfer lines to said first and second nodes respectively;

a second selection circuit disposed to connect second ends of said two signal transfer lines selected by said first selection circuit to said third and fourth nodes respectively;

a first connection circuit disposed to connect said first signal transfer line and said third signal transfer line with each other when said third signal transfer line has precedently been at a logical low level and said first signal transfer line presently transfers a signal of a logical low level;

a second connection circuit disposed to connect said first signal transfer line and said third signal transfer line with each other when said first signal transfer line has precedently been at a logical low level and said third signal transfer line presently transfers a signal of a logical low level;

a third connection circuit disposed to connect said first signal transfer line and said fourth signal transfer line with each other when said fourth signal transfer line has precedently been at a logical low level and said first signal transfer line presently transfers a signal of a logical low level;

a fourth connection circuit disposed to connect said first signal transfer line and said fourth signal transfer line with each other when said first signal transfer line has precedently been at a logical low level and said fourth signal transfer line presently transfers a signal of a logical low level;

a fifth connection circuit disposed to connect said second signal transfer line and said third signal transfer line with each other when said third signal transfer line has precedently been at a logical low level and said second signal transfer line presently transfers a signal of a logical low level;

a sixth connection circuit disposed to connect said second signal transfer line and said third signal transfer line with each other when said second signal transfer line has precedently been at a logical low level and said third signal transfer line presently transfers a signal of a logical low level;

a seventh connection circuit disposed to connect said second signal transfer line and said fourth signal transfer line with each other when said fourth signal transfer line has precedently been at a logical low level and said second signal transfer line presently transfers a signal of a logical low level;

an eighth connection circuit disposed to connect said second signal transfer line and said fourth signal transfer line with each other when said second signal transfer line has precedently been at a logical low level and said fourth signal transfer line presently transfers a signal of a logical low level;

a first precharge circuit disposed to precharge said first signal transfer line at a logical high level after a lapse of a prescribed time from connection by said second or fourth connection circuit;

a second precharge circuit disposed to precharge said second signal transfer line at a logical high level after a lapse of a prescribed time from connection by said sixth or eighth connection circuit;

a third precharge circuit disposed to precharge said third signal transfer line at a logical high level after a lapse of a prescribed time from connection by said first or fifth connection circuit; and a fourth precharge circuit disposed to precharge said fourth signal transfer line at a logical high level after a lapse of a prescribed time from connection by said third or seventh connection circuit.

14. The data transfer circuit according to claim 13, wherein said first connection circuit includes:

a first transistor connected between said first signal transfer line and said third signal transfer line and having a gate connected to said first signal transfer line between a node on said first signal transfer line and said first selection circuit, and second transistor connected between said first transistor and said third signal transfer line and having a gate connected to said third signal transfer line, said second connection circuit includes:

a third transistor connected between said first signal transfer line and said third signal transfer line and having a gate connected to said third signal transfer line between a node on said third signal transfer line and said first selection circuit, and a fourth transistor connected between said third transistor and said first signal transfer line and having a gate connected to said first signal transfer line, said third connection circuit includes:

a fifth transistor connected between said first signal transfer line and said fourth signal transfer line and having a gate connected to said first signal transfer line between a node on said first signal transfer line and said first selection circuit, and a sixth transistor connected between said fifth transistor and said fourth signal transfer line and having a gate connected to said fourth signal transfer line, said fourth connection circuit includes:

a seventh transistor connected between said first signal transfer line and said fourth signal transfer line and having a gate connected to said fourth signal transfer line between a node on said fourth signal transfer line and said first selection circuit, and an eighth transistor connected between said seventh transistor and said first signal transfer line and having a gate connected to said first signal transfer line, said fifth connection circuit includes:

a ninth transistor connected between said second signal transfer line and said third signal transfer line and having a gate connected to said second signal transfer line between a node on said second signal transfer line and said first selection circuit, and a tenth transistor connected between said ninth transistor and said third signal transfer line and having a gate connected to said third signal transfer line, said sixth connection circuit includes:

an eleventh transistor connected between said second signal transfer line and said third signal transfer line and having a gate connected to said third signal transfer line between a node on said third signal transfer line and said first selection circuit, and a twelfth transistor connected between said eleventh transistor and said second signal transfer line and having a gate connected to said second signal transfer line, said seventh connection circuit includes:

a thirteenth transistor connected between said second signal transfer line and said fourth signal transfer line and having a gate connected to said second signal transfer line between a node on said second signal transfer line and said first selection circuit, and a fourteenth transistor connected between said thirteenth transistor and said fourth signal transfer line and having a gate connected to said fourth signal transfer line, and said eighth connection circuit includes:
a fifteenth transistor connected between said second signal transfer line and said fourth signal transfer line and having a gate connected to said fourth signal transfer line between a node on said fourth signal transfer line and said first selection circuit, and
a sixteenth transistor connected between said fifteenth transistor and said second signal transfer line and having a gate connected to said second signal transfer line.

15. The data transfer circuit according to claim 13, wherein said first connection circuit includes:
a first transistor connected between said first signal transfer line and said third signal transfer line, and
a first OR circuit having a first input node connected to said first signal transfer line between a node connecting said first transistor and said first signal transfer line with each other and said first selection circuit and a second input node connected to said third signal transfer line, said second connection circuit includes:
a second transistor connected between said first signal transfer line and said third signal transfer line, and
a second OR circuit having a first input node connected to said third signal transfer line between a node connecting said second transistor and said third signal transfer line with each other and said first selection circuit and a second input node connected to said first signal transfer line, said third connection circuit includes:
a third transistor connected between said first signal transfer line and said fourth signal transfer line, and
a third OR circuit having a first input node connected to said first signal transfer line between a node connecting said third transistor and said first signal transfer line with each other and said first selection circuit and a second input node connected to said fourth signal transfer line, said fourth connection circuit includes:
a fourth transistor connected between said first signal transfer line and said fourth signal transfer line, and
a fourth OR circuit having a first input node connected to said fourth signal transfer line between a node connecting said fourth transistor and said fourth signal transfer line with each other and said first selection circuit and a second input node connected to said first signal transfer line, said fifth connection circuit includes:
a fifth transistor connected between said second signal transfer line and said third signal transfer line, and
a fifth OR circuit having a first input node connected to said second signal transfer line between a node connecting said fifth transistor and said second signal transfer line with each other and said first selection circuit and a second input node connected to said third signal transfer line, said sixth connection circuit includes:
a sixth transistor connected between said second signal transfer line and said third signal transfer line, and
a sixth OR circuit having a first input node connected to said third signal transfer line between a node connecting said sixth transistor and said third signal transfer line with each other and said first selection circuit and a second input node connected to said second signal transfer line, said seventh connection circuit includes:
a seventh transistor connected between said second signal transfer line and said fourth signal transfer line, and
a seventh OR circuit having a first input node connected to said second signal transfer line between a node connecting said seventh transistor and said second signal transfer line with each other and said first selection circuit and a second input node connected to said fourth signal transfer line, said eighth connection circuit includes:
an eighth transistor connected between said second signal transfer line and said fourth signal transfer line, and
an eighth OR circuit having a first input node connected to said fourth signal transfer line between a node connecting said eighth transistor and said fourth signal transfer line with each other and said first selection circuit and a second input node connected to said second signal transfer line, and
said first to eighth transistors are turned on/off in response to outputs from said first to eighth OR circuits respectively.

16. The data transfer circuit according to claim 13, wherein said first connection circuit includes:
first and second transistors serially connected between said first signal transfer line and said third signal transfer line,
a first NAND circuit having a first input node connected to said first signal transfer line between a node connecting said first transistor and said first signal transfer line with each other and said first selection circuit and a second input node connected to a power supply node, and
a second NAND circuit having a first input node connected to said third signal transfer line and a second input node connected to a power supply node, said second connection circuit includes:
third and fourth transistors serially connected between said third signal transfer line and said first signal transfer line,
a third NAND circuit having a first input node connected to said third signal transfer line between a node connecting said third transistor and said third signal transfer line with each other and said first selection circuit and a second input node connected to a power supply node, and
a fourth NAND circuit having a first input node connected to said first signal transfer line and a second input node connected to a power supply node, said third connection circuit includes:
fifth and sixth transistors serially connected between said first signal transfer line and said fourth signal transfer line,
a fifth NAND circuit having a first input node connected to said first signal transfer line between a node connecting said fifth transistor and said first signal transfer line with each other and said first selection circuit and a second input node connected to a power supply node, and
a sixth NAND circuit having a first input node connected to said fourth signal transfer line and a second input node connected to a power supply node, said fourth connection circuit includes:
seventh and eighth transistors serially connected between said fourth signal transfer line and said first signal transfer line, a seventh NAND circuit having a first input node connected to said fourth signal transfer line between a node connecting said seventh transistor and said fourth signal transfer line with each other and said first selection circuit and a second input node connected to a power supply node, and an eighth NAND circuit having a first input node connected to said first signal transfer line and a second input node connected to a power supply node, said fifth connection circuit includes:

ninth and tenth transistors serially connected between said second signal transfer line and said third signal transfer line, a ninth NAND circuit having a first input node connected to said second signal transfer line between a node connecting said ninth transistor and said second signal transfer line with each other and said first selection circuit and a second input node connected to a power supply node, and a tenth NAND circuit having a first input node connected to said third signal transfer line and a second input node connected to a power supply node, said sixth connection circuit includes:

eleventh and twelfth transistors serially connected between said third signal transfer line and said second signal transfer line, an eleventh NAND circuit having a first input node connected to said third signal transfer line between a node connecting said eleventh transistor and said third signal transfer line with each other and said first selection circuit and a second input node connected to a power supply node, and a twelfth NAND circuit having a first input node connected to said second signal transfer line and a second input node connected to a power supply node, said seventh connection circuit includes:

thirteenth and fourteenth transistors serially connected between said second signal transfer line and said fourth signal transfer line, a thirteenth NAND circuit having a first input node connected to said second signal transfer line between a node connecting said thirteenth transistor and said second signal transfer line with each other and said first selection circuit and a second input node connected to a power supply node, and a fourteenth NAND circuit having a first input node connected to said fourth signal transfer line and a second input node connected to a power supply node, said eighth connection circuit includes:

fifteenth and sixteenth transistors serially connected between said fourth signal transfer line and said second signal transfer line, a fifteenth NAND circuit having a first input node connected to said fourth signal transfer line between a node connecting said fifteenth transistor and said fourth signal transfer line with each other and said first selection circuit and a second input node connected to a power supply node, and a sixteenth NAND circuit having a first input node connected to said second signal transfer line and a second input node connected to a power supply node, and said first to sixteenth transistors have gates receiving outputs from said first to sixteenth NAND circuits respectively.

17. The data transfer circuit according to claim 5, further comprising:

a first connection circuit connecting said first signal transfer line and said second signal transfer line with each other when said second signal transfer line has not been precedently selected and said first signal transfer line presently transfers a signal of a logical low level, a second connection circuit connecting said first signal transfer line and said second signal transfer line with each other when said first signal transfer line has not been precedently selected and said second signal transfer line presently transfers a signal of a logical low level, a third connection circuit connecting said first signal transfer line and said third signal transfer line with each other when said third signal transfer line has not been precedently selected and said first signal transfer line presently transfers a signal of a logical low level, a fourth connection circuit connecting said first signal transfer line and said third signal transfer line with each other when said first signal transfer line has not been precedently selected and said third signal transfer line presently transfers a signal of a logical low level, a fifth connection circuit connecting said second signal transfer line and said third signal transfer line with each other when said third signal transfer line has not been precedently selected and said second signal transfer line presently transfers a signal of a logical low level, and a sixth connection circuit connecting said second signal transfer line and said third signal transfer line with each other when said second signal transfer line has not been precedently selected and said third signal transfer line presently transfers a signal of a logical low level, and said precharge circuit precharges said non-selected signal transfer line at a logical high level after a lapse of a prescribed time from connection by said first to sixth connection circuits.

* * * * *